(12) United States Patent
Tamai et al.

(10) Patent No.: US 7,745,839 B2
(45) Date of Patent: Jun. 29, 2010

(54) DOUBLE WAVELENGTH SEMICONDUCTOR LIGHT EMITTING DEVICE AND METHOD OF MANUFACTURING THE SAME

(75) Inventors: Shinichi Tamai, Kyoto (JP); Ken Nakahara, Kyoto (JP); Atsushi Yamaguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 49 days.

(21) Appl. No.: 12/224,287

(22) PCT Filed: Feb. 23, 2007

(86) PCT No.: PCT/JP2007/053367
§ 371 (c)(1),
(2), (4) Date: Aug. 22, 2008

(87) PCT Pub. No.: WO2007/097411
PCT Pub. Date: Aug. 30, 2007

(65) Prior Publication Data
US 2009/0127570 A1    May 21, 2009

(30) Foreign Application Priority Data

Feb. 23, 2006 (JP) .............................. 2006-047099
Feb. 23, 2006 (JP) .............................. 2006-047100

(51) Int. Cl.
*H01L 33/00* (2010.01)
(52) U.S. Cl. .............................. 257/89; 257/90; 257/93; 257/96; 257/97; 257/103; 257/E33.025
(58) Field of Classification Search .................. 257/89, 257/90, 93, 96, 97, 103, E33.025
See application file for complete search history.

(56) References Cited

U.S. PATENT DOCUMENTS

| 5,812,576 | A | 9/1998 | Bour |
| 7,473,936 | B2 * | 1/2009 | Tran et al. ...................... 257/95 |

(Continued)

FOREIGN PATENT DOCUMENTS

JP          10-093200          4/1998

(Continued)

*Primary Examiner*—Ngan Ngo
(74) *Attorney, Agent, or Firm*—Rabin & Berdo, P.C.

(57) ABSTRACT

Provided are a double wavelength semiconductor light emitting device, having an n electrode and p electrode disposed on the same surface side, in which the area of a chip is reduced to increase the number of chips taken from one single wafer, in which light focusing performance of double wavelength optical beams are improved, and in which an active layer of a light emitting element having a longer wavelength can be prevented from deteriorating in a process of manufacturing; and a method of manufacturing the same.

Semiconductor lasers D1 and D2 as two light emitting elements having different wavelengths are integrally formed on a common substrate 1. A semiconductor laminate A is deposited on an n-type contact layer 21 in a semiconductor laser D1, and a semiconductor laminate B is deposited in a semiconductor laser D2. The semiconductor laminate A and semiconductor laminate B are configured to have different layer structures. An n electrode 12 formed between the semiconductor lasers D1 and D2 is shared by the semiconductor lasers D1 and D2, and serves as a common electrode on an n side. Additionally, the semiconductor laminate having a shorter wavelength is crystal-grown firstly.

8 Claims, 16 Drawing Sheets

U.S. PATENT DOCUMENTS

| | | |
|---|---|---|
| 7,605,403 B2 * | 10/2009 | Horio et al. .................. 257/91 |
| 2004/0105471 A1 | 6/2004 | Kneissl et al. |
| 2005/0218422 A1 | 10/2005 | Tojo et al. |
| 2008/0211416 A1 * | 9/2008 | Negley et al. ............... 315/193 |
| 2009/0122822 A1 * | 5/2009 | Murayama ............... 372/43.01 |
| 2009/0325334 A1 * | 12/2009 | Kwak et al. .................. 438/46 |

FOREIGN PATENT DOCUMENTS

| | | |
|---|---|---|
| JP | 11-087856 | 3/1999 |
| JP | 2000-196197 | 7/2000 |
| JP | 2002-314198 | 10/2002 |
| JP | 2002-314201 | 10/2002 |
| JP | 2003-069152 | 3/2003 |
| JP | 2003-101156 | 4/2003 |
| JP | 2005-129686 | 5/2005 |

* cited by examiner

DOUBLE WAVELENGTH SEMICONDUCTOR LIGHT EMITTING DEVICE AND METHOD OF MANUFACTURING THE SAME

TECHNICAL FIELD

The present invention relates to a double wavelength semiconductor light emitting device in which two light emitting elements emitting lights with different wavelengths are formed on a single substrate, and to a method of manufacturing the same.

BACKGROUND ART

In recent years, efforts have been focused on developing a short wavelength semiconductor laser for the purpose of its application to high-density optical disk recording and the like. A nitrogen-containing hexagonal compound semiconductor such as GaN, AlGaN, InGaN, InGaAlN and GaPN (hereinafter, simply referred to as a nitride semiconductor) is used for the short wavelength semiconductor laser.

With rapid increase of communication traffic accompanying explosive spread of the Internet, expectations for not only optical communication technologies enabling high-speed and large-capacity communications, but also a high-speed transfer and large-capacity optical disk, and a highly-efficient optical device such as an LED light emitting element have been significantly grown. For example, an element on which two different semiconductor lasers are mounted to support both a CD-Rewritable method and a DVD-Rewritable method, and a double wavelength semiconductor laser to support multiplex communications have actively been developed.

Under these circumstances, as described in Patent Document 1, there is proposed a semiconductor light emitting device in which an n-GaN buffer layer is formed on a substrate; by using this n-GaN buffer layer as a common semiconductor layer, an n-type semiconductor layer, an active layer and a p-type semiconductor layer of each of the double wavelength light emitting elements are laminated on the n-GaN buffer layer; and a p electrode and an n electrode of each light emitting element are disposed opposite to each other across the substrate.

Moreover, a monolithically integrated light emitting element lasing with double wavelengths is manufactured for the semiconductor light emitting device described in the Patent Document 1. Hexagonal nitride semiconductor layers are formed on the main surface of the semiconductor substrate so that the semiconductor lasers have a planar surface parallel to the main surface of the substrate and also have a sloping surface inclined from the main surface, respectively. Subsequently, active layers are epitaxially grown on the planar and inclined surfaces of the semiconductor layers, so that the active layers containing In at composition ratios different from each other are formed to enable laser with double wavelengths.

DISCLOSURE OF THE INVENTION

Problems to be Solved by the Invention

However, the conventional configuration described above has a structure in which the p electrode and n electrode of each double wavelength light emitting element are opposite to each other across the substrate. Therefore, light emitting elements can be formed relatively close to each other. Consequently, the area per chip, as one chip is composed of double wavelength light emitting elements, can be reduced to a relatively small one, so that a relatively large number of chips can be manufactured from a single wafer. However, in a case of a structure in which a p electrode and an n electrode are disposed on the same surface side of a substrate, the p electrode and n electrode of each light emitting element are consequently arranged on the same surface side of the substrate, and thereby the chip area is increased. This causes a problem of reducing the number of chips to be taken from the same wafer.

Furthermore, in the structure in which the p electrode and the n electrode are disposed on the same surface side of the substrate, the n electrode need to be disposed on an n-GaN buffer layer, and the n electrode is disposed between the light emitting elements. A distance between the active layers of the two light emitting elements is consequently increased, and this also increases a distance between double wavelength optical beams. Accordingly, there arises a problem that light focusing performance is deteriorated.

Thus, a method of manufacturing a monolithically integrated light emitting element lasing with double wavelengths enables simultaneous crystal growth of double wavelength active layers, resulting in a reduced number of manufacturing processes. However, this method also produces a problem that device characteristics are deteriorated because an optical guide layer and a clad layer with an active layer sandwiched therebetween are monolithically formed in each of two light emitting elements. That is, the refraction index of each semiconductor layer such as the optical guide layer and the clad layer depends on the wavelength of light. Therefore, variation in emission wavelength changes the refraction index of each semiconductor layer with respect to emitted light, and thus the optical confinement effect differs between two light emitting elements including the optical guide layers and the clad layers which have the same composition. Consequently, a semiconductor light emitting device having a good performance cannot be manufactured.

To avoid this, it is only necessary to manufacture double wavelength light emitting elements in separate processes, although the number of manufacturing processes is consequently increased. When the growth temperature of a semiconductor layer formed after crystal growth of an active layer is high, the active layer is exposed to the high temperature. Accordingly, the light emitting element having an active layer composed of In-containing nitride has a problem that the formed active layer tends to be more easily destroyed as the In content ratio increases, i.e., as the light emitting element has a longer wavelength.

The present invention is made to solve the foregoing problems and an object is to provide a double semiconductor light emitting device; for which a chip area can be reduced to increase the number of chips to be taken from one single wafer, in which light focusing performance of double wavelength optical beams can be improved, and in which an active layer of a light emitting element having a longer wavelength can be prevented from deteriorating during a manufacturing process; and a method of manufacturing the same.

Means for Solving the Problems

In order to achieve the above object, the invention according to a first aspect of the invention is a double wavelength semiconductor light emitting device in which two light emitting elements emitting lights having different wavelengths are formed on one single substrate and in which an n electrode and p electrodes corresponding to the two light emitting elements are disposed on the same surface side of the substrate, characterized in that the n electrode is an n side electrode common to the two light emitting elements.

The invention according to a second aspect is a double wavelength semiconductor light emitting device in which two laminates emitting lights having different wavelengths are formed on one substrate and in which n electrodes and p electrodes corresponding to the two laminates are disposed on the same surface side of the substrate, characterized in that the two n electrodes corresponding to the two laminates are disposed to sandwich the two laminates on the substrate.

The invention according to a third aspect is a method of manufacturing a double wavelength semiconductor light emitting device in which two light emitting elements emitting lights having different wavelengths are formed on one single substrate, in which an n electrode and p electrodes corresponding to the two light emitting elements are disposed on the same surface side of the substrate, and in which active layers in the two light emitting elements are composed of nitride layers containing In at different ratios, characterized in that a first light emitting element that is one of the two light emitting elements including an active layer having a lower In composition ratio is crystal-grown, a second light emitting element that is the other light emitting element having a higher In composition ratio is then crystal-grown, and thereafter the n electrode common to the first light emitting element and the second light emitting element is formed.

The invention according to a fourth aspect is the method of manufacturing a double wavelength semiconductor light emitting device according to the method of the third aspect, characterized in that n-type GaN is used as a barrier layer in an active layer of the second light emitting element.

The invention according to a fifth aspect is the method of manufacturing a double wavelength semiconductor light emitting device according to either of the third or the fourth aspect, characterized in that only an InGaN layer is formed as a p-type semiconductor layer after crystal growth of the active layer of the second light emitting element.

The invention according to a sixth aspect is the method of manufacturing a double wavelength semiconductor light emitting device according to any one of the third to fifth aspects, characterized in that, before crystal growth of the second light emitting element is performed, a Si-based film is deposited on a laminate of the first light emitting element and on an n-type contact layer common to the first light emitting element and second light emitting element.

The invention according to a seventh aspect is a method of manufacturing a double wavelength semiconductor light emitting device in which two laminates emitting lights having different wavelengths are formed on one single substrate, in which an n electrode and a p electrodes corresponding to the two laminates are disposed on the same surface side of the substrate, and in which active layers in the two laminates are composed of nitride layers containing In at different ratios, characterized in that a first laminate that is one of the two laminates including an active layer having a lower In composition ratio is crystal-grown, a second laminate that is the other laminate having a higher In composition ratio is then crystal-grown, and thereafter two n electrodes are formed on the substrate to sandwich the first laminate and the second laminate.

The invention according to an eighth aspect is the method of manufacturing a double wavelength semiconductor light emitting device according to the seventh aspect, characterized in that n-type GaN is used as a barrier layer in an active layer of the second laminate.

The invention according to a ninth aspect is the method of manufacturing a double wavelength semiconductor light emitting device according to either of the seventh or eighth aspect, characterized in that only an InGaN layer is formed as a p-type semiconductor layer after crystal growth of the active layer of the second laminate.

The invention according to a tenth aspect is the method of manufacturing a double wavelength semiconductor light emitting device according to any one of the seventh to ninth aspects, characterized in that, before crystal growth of the first laminate is performed, a Si-based film is formed on the substrate except for an area in which the first laminate is to be deposited.

The invention according to an eleventh aspect is the method of manufacturing a double wavelength semiconductor light emitting device according to any one of the seventh to tenth aspects, characterized in that, before crystal growth of the second laminate is performed, a Si-based film is formed on the first laminate and on the substrate except for an area in which the second laminate is to be deposited.

Effect of the Invention

According to a first double wavelength semiconductor light emitting device of the present invention, two light emitting elements which emit lights having different wavelengths are formed on a single substrate, and an n electrode and p electrodes corresponding to the two light emitting elements are formed on the same surface side of the substrate. However, since the n electrode is shared by the two light emitting elements as a common electrode. Consequently, one chip area can be reduced and the number of chips to be taken from the same wafer can be increased. Additionally, focusing performance can be improved as compared to an element having a conventional structure.

According to a second double wavelength semiconductor light emitting device of the present invention, two laminates which emit lights having different wavelengths are formed on a single substrate, and n electrodes and p electrodes corresponding to the two laminates are formed on the same surface side of the substrate. However, the two n electrodes are not formed between the two laminates but formed at both sides of the two laminates on the substrate. Consequently, the two laminates can be laminated in positions close to each other to have the short wavelength side active layer and the long wavelength side active layer in closer positions. Therefore, an area per chip can be reduced and the number of chips to be taken from the same wafer can be increased. Additionally, focusing performance can be improved more than the above first double wavelength semiconductor light emitting device.

Moreover, with respect to both the first and second double semiconductor light emitting devices, a long wavelength light emitting element or laminate having an active layer composed of nitride having a higher In content ratio is epitaxially grown after the short wavelength light emitting element or laminate in the manufacturing process. Therefore, a duration of exposure of a long wavelength side active layer to a high temperature is reduced and thereby deterioration of the long wavelength side active layer can be prevented.

DESCRIPTION OF SYMBOLS

Figure 1:
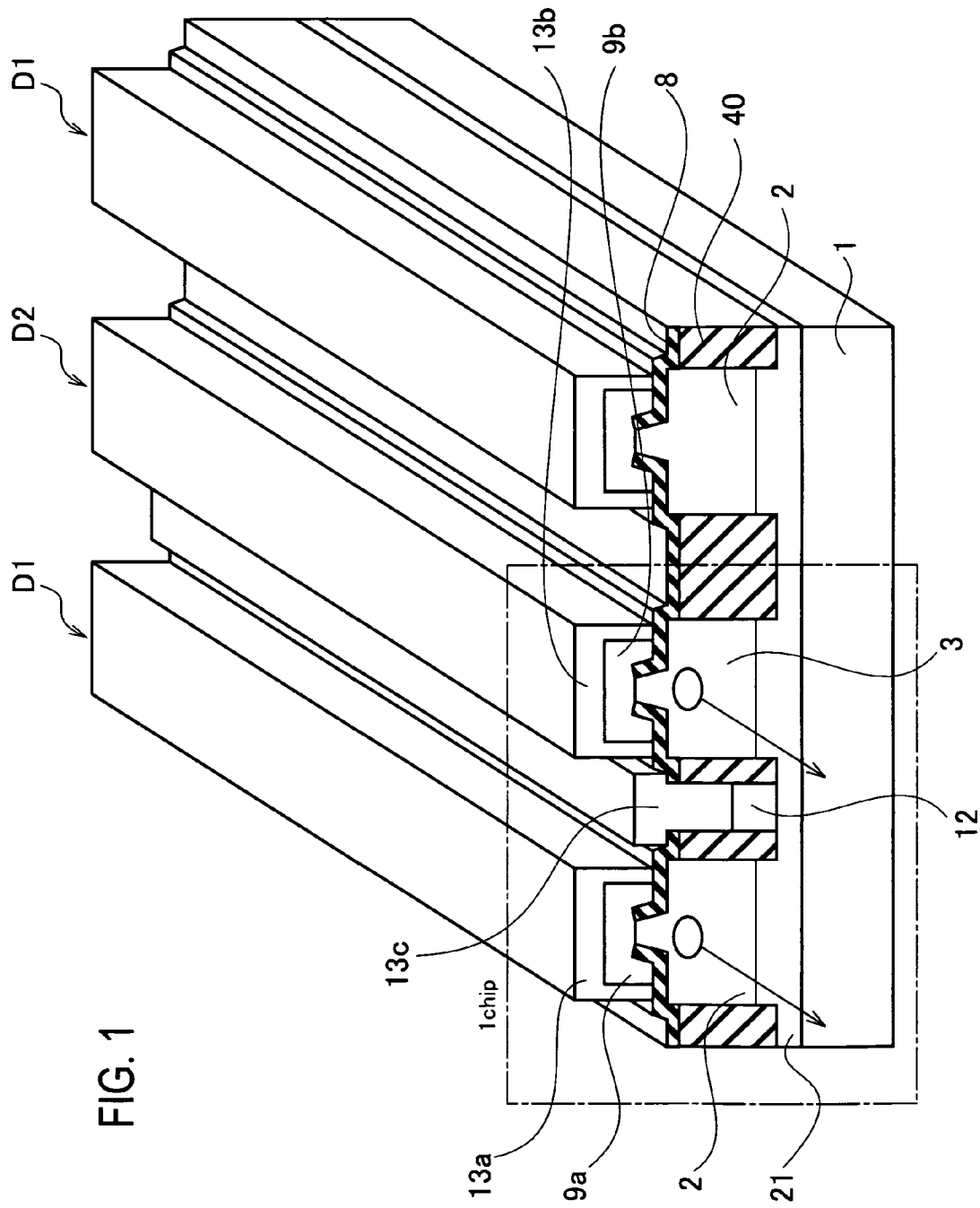
FIG. 1 is a view illustrating a schematic structure of a first double wavelength light emitting device of the present invention.
Figure 2:
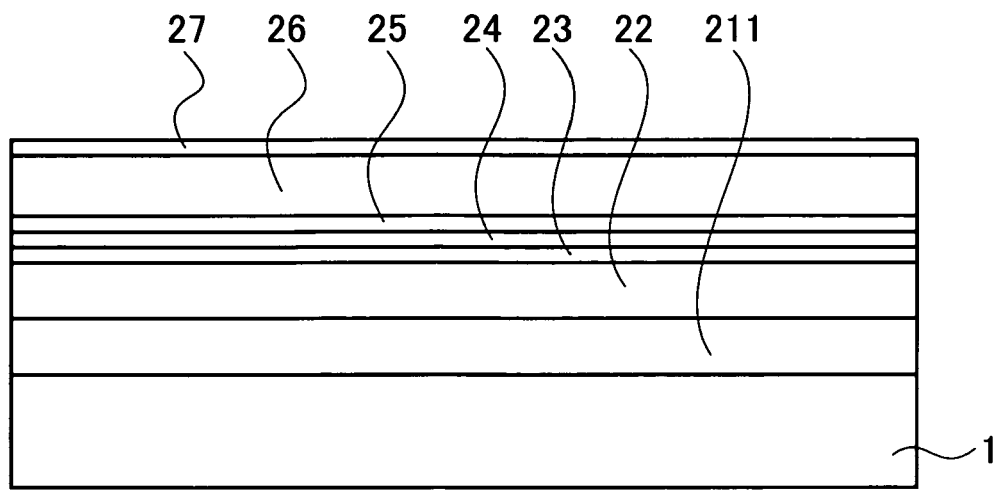
FIG. 2 is a view illustrating a process of manufacturing the first double wavelength light emitting device.

1 Substrate
2 Semiconductor laminate A
3 Semiconductor laminate B
8 Insulating film
9a p electrode
9b p electrode
12 n electrode
13a p side pad electrode
13b p side pad electrode
13c n side pad electrode
21 n-type contact layer
32, 82 n-type AlGaN clad layer
33, 83 n-type GaN optical guide layer
34, 84 InGaN active layer
35, 85 p-type InGaN layer
40 Insulating film
51 Substrate
52 Semiconductor laminate C
53 Semiconductor laminate D
56 Insulating film
58 Insulating film
59a p electrode
59b p electrode
61a n electrode
61b n electrode
62a p side pad electrode
62b n side pad electrode
62c p side pad electrode
62d n side pad electrode
70 Growth substrate
71 n-type contact layer

BEST MODE FOR CARRYING OUT THE INVENTION

An embodiment of the present invention will be described below with reference to drawings. FIG. 1 shows a schematic structure of the first double wavelength semiconductor light emitting device according to the present invention.

On a common substrate 1 for growth, semiconductor lasers D1 and D2 are integrally formed as two light emitting elements having different emission wavelengths. A sapphire substrate, GaN substrate, SiC substrate or the like is used for the substrate 1. On a common substrate 1 for growth, an n-type contact layer 21 commonly used by each of the semiconductor lasers D1 and D2 is deposited.

A portion surrounded by a dashed-dotted line constitutes one chip. In reality, one chip as a set of the semiconductor layer D1 and D2 is formed in a way that multiple sets of semiconductor lasers D1 and D2 are repeatedly formed on a wafer; and then are divided into chips by, for example, dicing the wafer at every portion surrounded by the dashed-dotted line. However, the adjacently formed semiconductor laser D1 is shown as in the drawing, because an entire shape is not made clear without showing another semiconductor laser D1 formed adjacently among repeatedly formed semiconductor lasers D1 and D2. Incidentally, arrows depicted in FIG. 1 indicate the output direction of the laser beam.

In the semiconductor laser D1, a semiconductor laminate A (2 in the figure) having a ridge portion in a stripe shape is deposited on the n-type contact layer 21. In the semiconductor laser D2, a semiconductor laminate B (3 in the figure) having a stripe-shape ridge portion is deposited on the n-type contact layer 21, similarly. A configuration is made to have different layer structures between the semiconductor laminate A (2) and the semiconductor laminate B (3). An insulating film 8 (a shaded area) is formed in a manner to cover the side surfaces of the ridge portions of the semiconductor laminates A and B. Parts of the n-type contact layer 21 have been removed by etching. Insulting films 40 (shaded areas) are formed on side surfaces of the n-type contact layer 21 down to the surface exposed by etching, and the side surfaces of each of the semiconductor laminates A and B.

Furthermore, a p electrode 9a is formed in a manner to cover the top of the ridge portion of the semiconductor laminate A and the insulating film 8. In the same manner, a p electrode 9b is formed in a manner to cover the top of the ridge portion of the semiconductor laminate B and the insulating film 8. Moreover, a p-side pad electrode 13a is formed on the p electrode 9a of the semiconductor laser D1 for wire bonding and the like, while a p-side pad electrode 13b is formed on the p electrode 9b of the semiconductor laser D2.

An n electrode 12 formed between the semiconductor lasers D1 and D2 is shared by the semiconductor lasers D1 and D2 to become a common electrode of an n-side. Therefore, an n-side pad electrode is not formed between the semiconductor laser D2 and the other semiconductor laser D1 (a semiconductor laser at a right end of FIG. 1) adjacent to the semiconductor laser D2. An n-side pad electrode 13c is formed on the n electrode 12 for wire bonding and the like.

In a double wavelength semiconductor light emitting device in which an n electrode and a p electrode are disposed on the same side as in the above manner, if the substrate 1 for growth and the n-type contact layer 21 are regarded as one substrate as a whole, the n electrode 12 is disposed on the same substrate so that this n electrode 12 can be commonly used by a long wavelength light emitting element and a short wavelength light emitting element, and thereby area of a chip can be reduced to increase the number of chips to be taken from a single wafer. Moreover, the focusing performance can also be improved.

A method of manufacturing a first double wavelength semiconductor light emitting device in FIG. 1 will be described by using FIGS. 2 to 16. Here, the semiconductor laser D1 is assumed to be, for example a short wavelength blue laser (a first light emitting element). The semiconductor laser D2 is assumed to be, for example a long wavelength green laser (a second light emitting element). A wafer including the substrate 1 and semiconductor layers deposited thereon extends in transverse, forward and backward directions of the paper, is shown, similarly to FIG. 1, with respect to a formation area of D1, D2 and D1 including another semiconductor laser D1 adjacently formed, among the repeatedly formed semiconductor lasers D1 and D2.

Firstly, to form a short wavelength semiconductor laser D1, the substrate 1 is placed in an MOCVD (metalorganic chemical vapor deposition) apparatus to be thermal-cleaned while hydrogen gas is flown and a temperature is increased to about 1050° C. The temperature is reduced to about 600° C. to grow a Si-doped n-type GaN contact layer 211 as an n-type contact layer 21. Then, the temperature inside the MOCVD apparatus is again increased to 1000° C. to grow a Si-doped n-type AlGaN clad layer 22 and a Si-doped n n-type GaN optical guide layer 23.

The temperature is subsequently reduced to about 750° C. to grow an InGaN active layer 24. Then, the temperature is increased to about 1000° C. to 1100° C. to sequentially deposit a Mg-doped p-type GaN optical guide layer 25, a Mg-doped p-type AlGaN clad layer 26 and a Mg-doped p-type GaN contact layer 27.

The InGaN active layer 24 may be of a single layer of InGaN and may also have a multiple quantum well structure. In the latter case, the multiple quantum well structure is configured by alternately laminating a well layer and a barrier layer (an obstacle layer) through several cycles where the well layer is formed of InGaN and the barrier layer is formed of undoped GaN or InGaN. As described above, D1 is assumed to be a semiconductor laser having a blue light emission wavelength (short wavelength side). Therefore, the InGaN active layer 24 preferably has an In composition of around 15% and has the InGaN well layer of around 30 Å.

The n-AlGaN clad layer 22 preferably has an Al composition of up to 10%. The film thickness is preferably 1.2 μm or less to prevent a crack. The n-GaN optical guide layer 23 may be an n-InGaN optical guide layer. In this case, an In composition is preferably up to 3%.

Also, the p-GaN optical guide layer 25 may be a p-InGaN optical guide layer. In this case, the composition In is preferably up to 3%. The p-AlGaN clad layer 26 preferably has an Al composition of the up to 10% and a film thickness of up to 0.4 μm.

Figure 3:
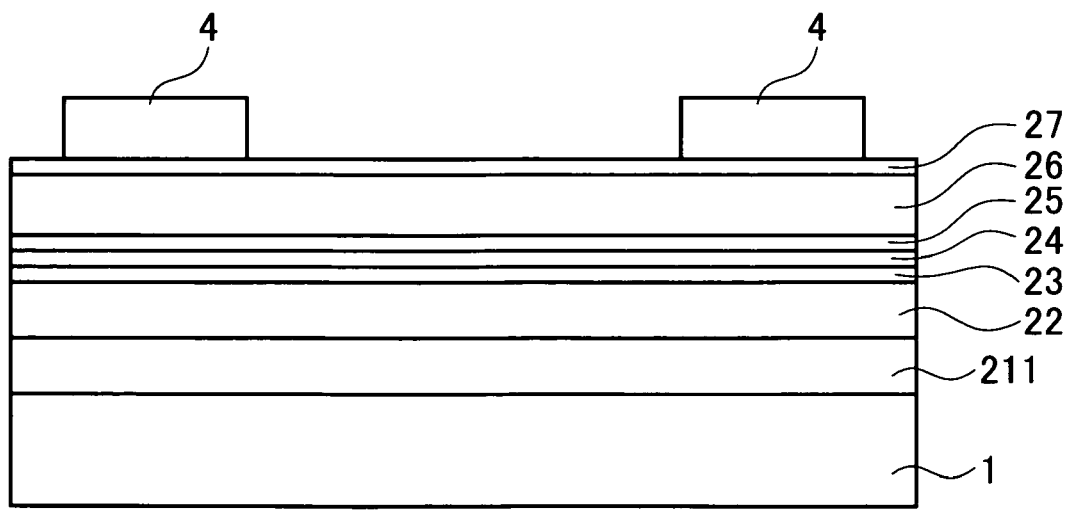
FIG. 3 is a view illustrating a process of manufacturing the first double wavelength light emitting device.
Figure 4:
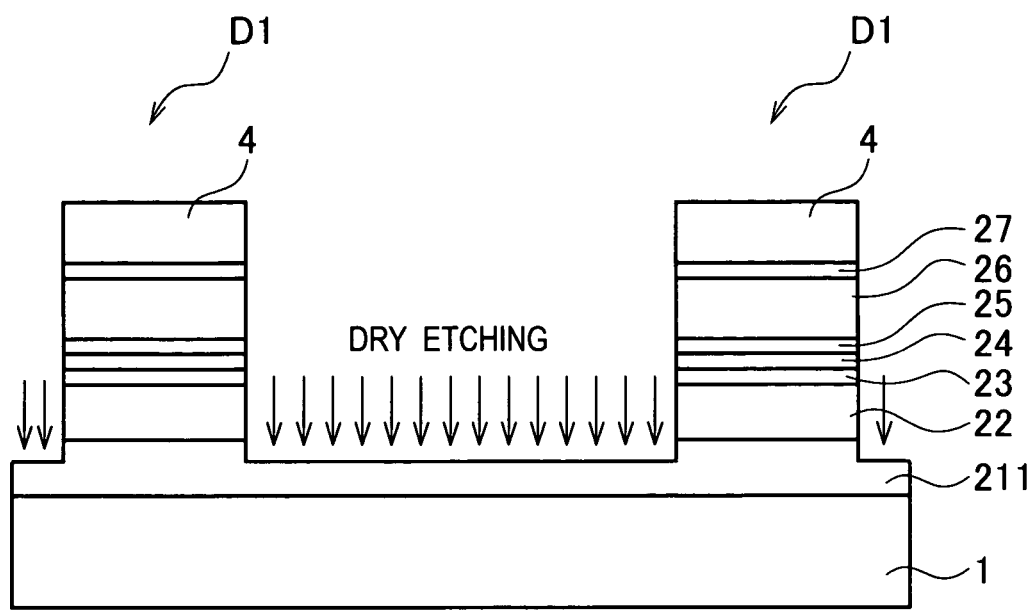
FIG. 4 is a view illustrating a process of manufacturing the first double wavelength light emitting device.

As shown in FIG. 3, a mask 4 is then patterned in an area in which the element shape of the short wavelength semiconductor laser D1 is formed. As shown in FIG. 4, the n-GaN contact layer 211 is dry-etched by use of ICP or the like, to a degree that the n-GaN contact layer 211 is slightly remove with a chlorine gas or the like to form a shape of the semiconductor laminate A of the semiconductor laser D1. Here, the n-AlGaN clad layer 22 to the p-GaN contact layer 27 correspond to the semiconductor laminate A (2).

Figure 5:
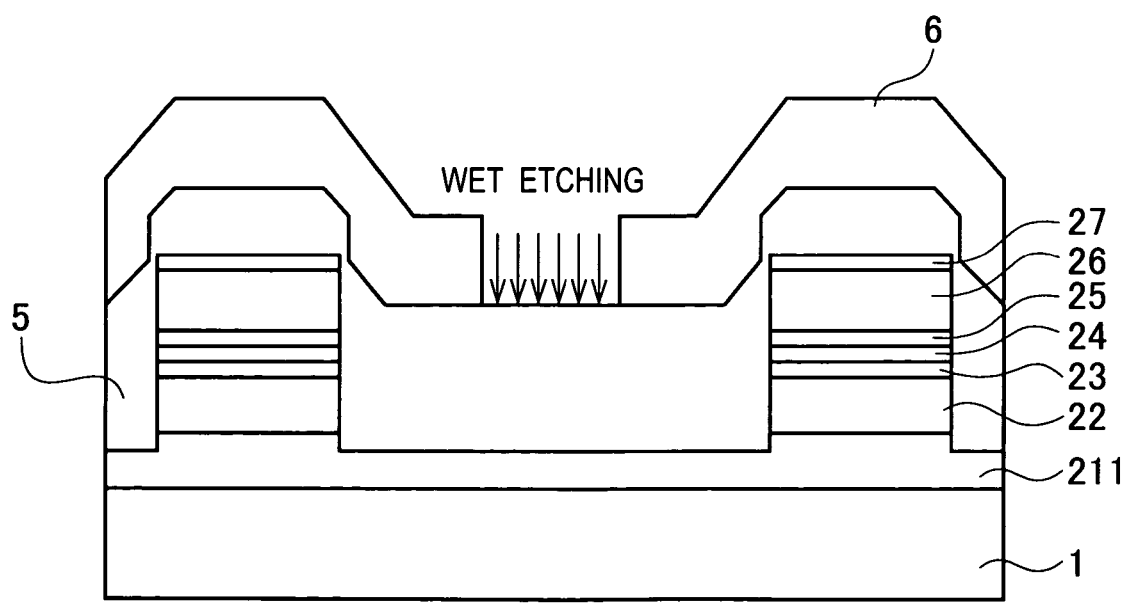
FIG. 5 is a view illustrating a process of manufacturing the first double wavelength light emitting device.

As Shown in FIG. 5, the mask 4 is removed to form a Si-based insulating film 5 over the entire surface. A mask 6 is patterned on the insulating film 5 except in an area in which a long wavelength semiconductor laser D2 is to be formed. A Si-based film, such as $SiO_2$, $Si_3N_4$ or the like, on which GaN is impossible to grow and which is easily wet-etched, is used for the insulating film 5. Use of this Si-based film does not cause a semiconductor layer to grow on the semiconductor laminate A side on which laminating has already been carried out, in a case where the semiconductor laminate B of the semiconductor laser D2 as described below is deposited, and therefore a shape of the semiconductor laminate B can be obtained by simply sequentially laminating semiconductor layers constituting the semiconductor laminate B. Then, the insulating film 5 located in the area in which the long wavelength semiconductor laser D2 is to be formed is removed by wet-etching. Subsequently, the mask 6 is lifted off.

Figure 6:
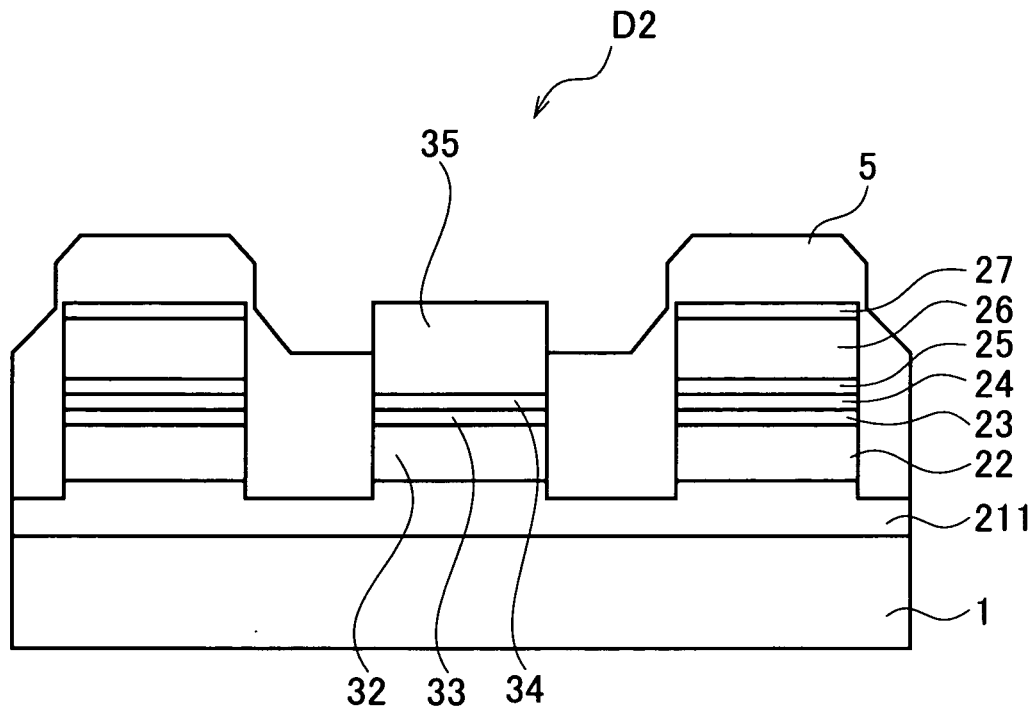
FIG. 6 is a view illustrating a process of manufacturing the first double wavelength light emitting device.

As shown in FIG. 6, the semiconductor laminate B of the semiconductor laser D2 is then formed. To grow the semiconductor laminate B, the temperature inside the MOCVD apparatus is again increased to about 1000° C. to crystal-grow the Si-doped n-type AlGaN clad layer 32 and the Si-doped n-type GaN optical guide layer 33 on the n-GaN contact layer 211. Then, the temperature is reduced to about 750° C. to grow InGaN active layer 34. Subsequently, the temperature is increased to about 850° C. to grow a Mg-doped p-type InGaN layer 35. The n-AlGaN clad layer 32 to the p-InGaN layer 35 correspond to the semiconductor laminate B (3).

The InGaN active layer 34 may be a single layer of Si-doped n-type InGaN and may also have a multiple quantum well structure. In the latter case, the multiple quantum well structure is configured by alternately laminating a well layer and a barrier layer through several cycles where the well layer is formed of Si-doped n-type InGaN and the barrier layer is formed of Si-doped n-type GaN. As described above, D2 is assumed to be a semiconductor laser having a green light emission wavelength (long wavelength side). Therefore, the InGaN active layer 34 preferably has an In composition of around 20% and has the InGaN well layer of around 30 Å.

The n-AlGaN clad layer 32 preferably has an Al composition of up to 10% as in the semiconductor laminate A of the semiconductor laser D1. The film thickness is preferably 1.2 μm or less to prevent a crack. The n-GaN optical guide layer 33 may be an n-InGaN optical guide layer. In this case, the In composition is preferably up to 3%. In addition, the p-InGaN layer 35 preferably has an In composition of up to 3% and a film thickness of 0.5 μm or less to obtain good film quality.

Meanwhile, $Al_xGa_yN$ (However, $X+Y=1$, $0 \leq X<1$, $0<Y \leq 1$) has been conventionally used for a p-type current injection layer. However, growth at a temperature higher than 1000° C. is necessary to obtain $Al_xGa_yN$ showing a good p-type conduction. However, growth of p-type $Al_xGa_yN$ at a temperature higher than 1000° C. particularly causes the InGaN active layer 34 having a large In composition on a long wavelength side to be easily deteriorated and destroyed. A light emitting device having a longer wavelength has an increased composition of In contained in the active layer. As the In composition is increased, In in the active layer sublimates and separates at a high temperature so that the active layer is easily deteriorated and destroyed. Therefore, the InGaN active layer 34 needs to be grown at 900° C. or less.

If the semiconductor laser D2 on the long wavelength side is first crystal-grown and if p-type AlGaN and GaN are also used for the semiconductor laser D2 side as in the semiconductor laser D1, the InGaN active layer 34 is exposed to a high temperature of 1000° C. to 1100° C. for a longer time period after the deposition of the InGaN active layer 34 having a large In composition. In contrast, by growing the semiconductor laser D1 on the short wavelength side first, a reduction is enabled in a duration of exposure of the InGaN active layer 34 to a high temperature of 1000° C. to 1100° C. after the deposition of the InGaN active layer 34 having a large In composition so that the InGaN active layer 34 can be prevented from being deteriorated.

Furthermore, as for the semiconductor laser D2, a p-GaN optical guide layer and a p-AlGaN clad layer are not formed unlike in the semiconductor laser D1, and a p-InGaN layer 35 is deposited on the InGaN active layer 34. Therefore, crystal growth is enabled at a low temperature of 900° C. or less even after the deposition of the InGaN active layer 34. In addition, in a case where the InGaN active layer 34 has a quantum well structure, having a barrier layer of n-type GaN enables growth at the same temperature as that in the well layer so that the InGaN active layer 34 can be prevented from being deteriorated and destroyed. Incidentally, the p-InGaN layer 35 serves as a semiconductor layer doing double duty of a clad layer and a contact layer.

Figure 7:
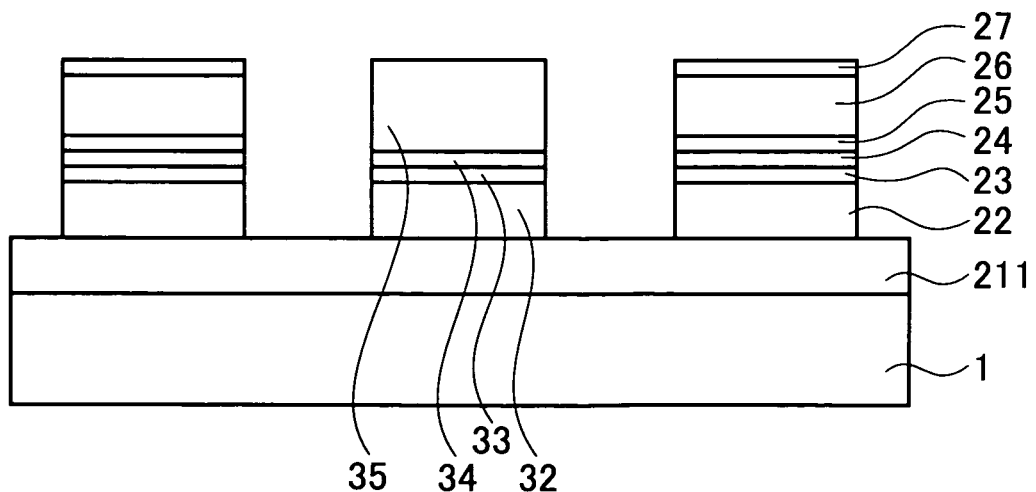
FIG. 7 is a view illustrating a process of manufacturing the first double wavelength light emitting device.
Figure 8:
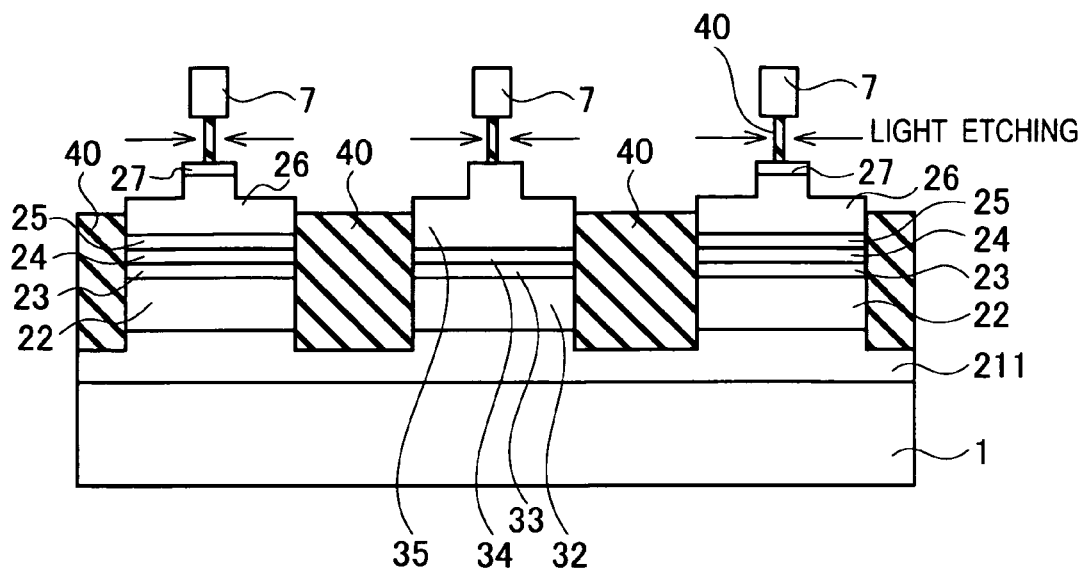
FIG. 8 is a view illustrating a process of manufacturing the first double wavelength light emitting device.

The insulating film 5 is then removed as shown in FIG. 7. To form stripe-shape ridge portions of the semiconductor lasers D1 and D2 at the same time, a mask 7 is thereafter formed by spattering after applying an insulating film 40. Subsequently, these masks are patterned and dry-etched so as to form a stripe shape, and the wafer is soaked in hydrofluoric acid and subjected to light-etching as shown in FIG. 8 to melt a part of the insulating film 40 and adjust the shape of the ridge portions as well.

Figure 9:
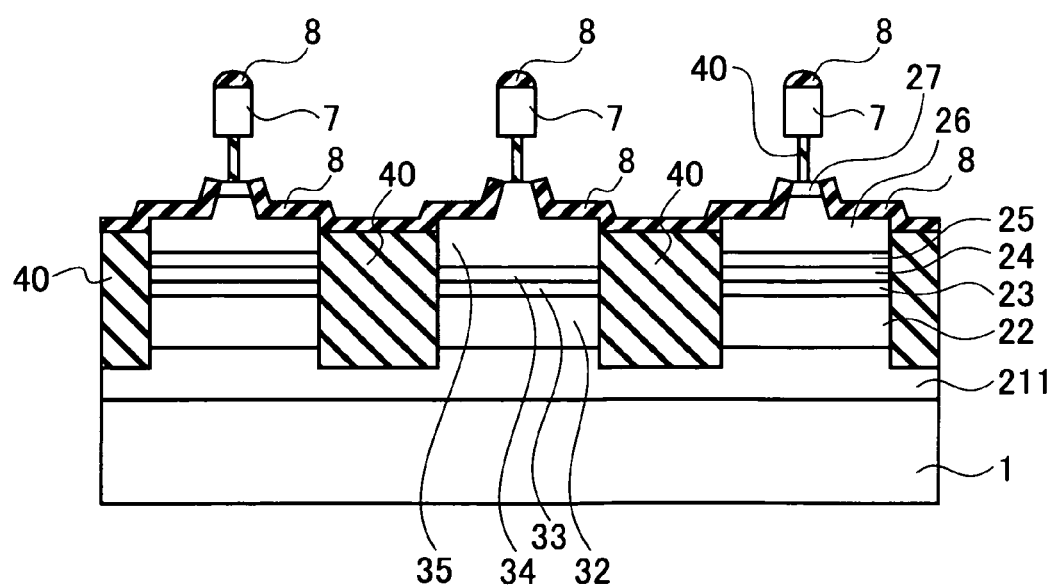
FIG. 9 is a view illustrating a process of manufacturing the first double wavelength light emitting device.
Figure 10:
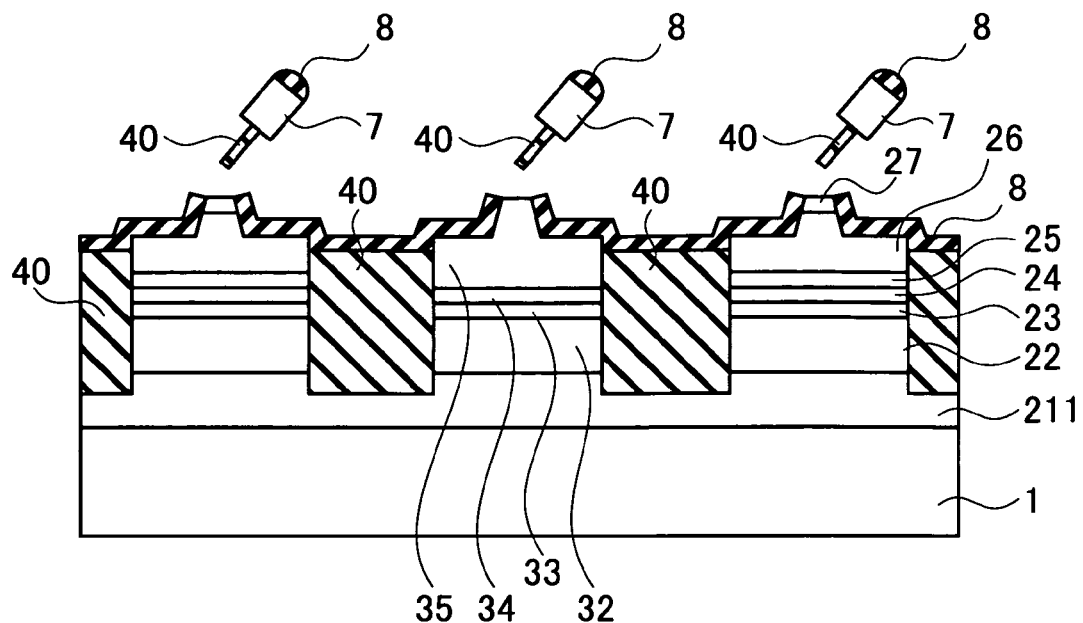
FIG. 10 is a view illustrating a process of manufacturing the first double wavelength light emitting device.

As shown in FIG. 9, an insulating film 8 made of a material different from that of the insulating film 40 is formed by spattering, on the side surface of the ridge portion of the semiconductor laminates A and B and the top surface of the insulating film 40. As shown in FIG. 10, the insulating film 40 on the ridge portion is completely melted in a state where the wafer is soaked in the hydrofluoric acid again to remove the mask 7 formed above the ridge portion and the insulating film 8.

Figure 11:
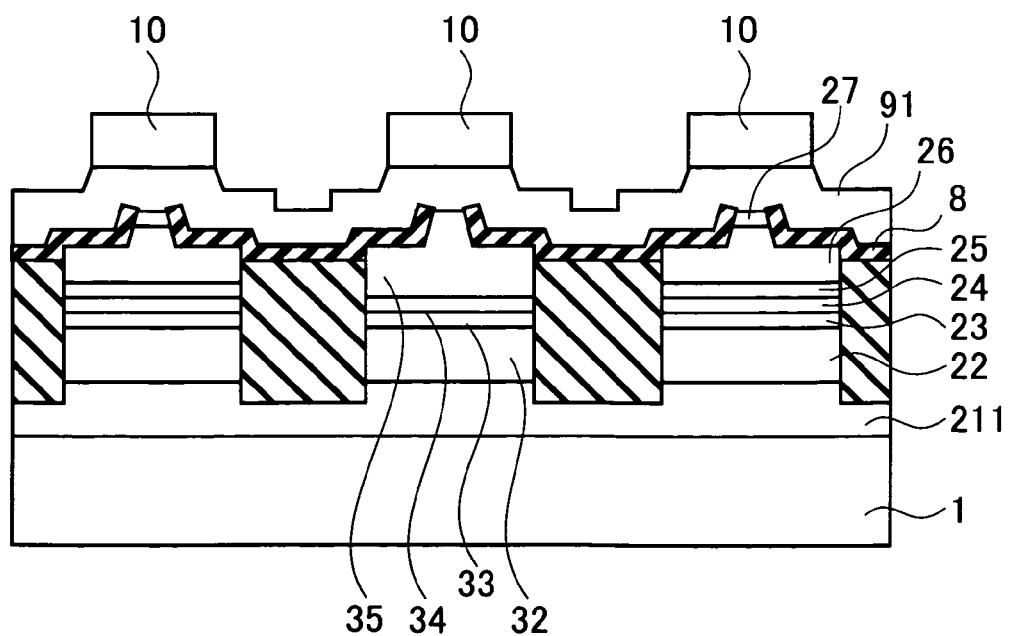
FIG. 11 is a view illustrating a process of manufacturing the first double wavelength light emitting device.
Figure 12:
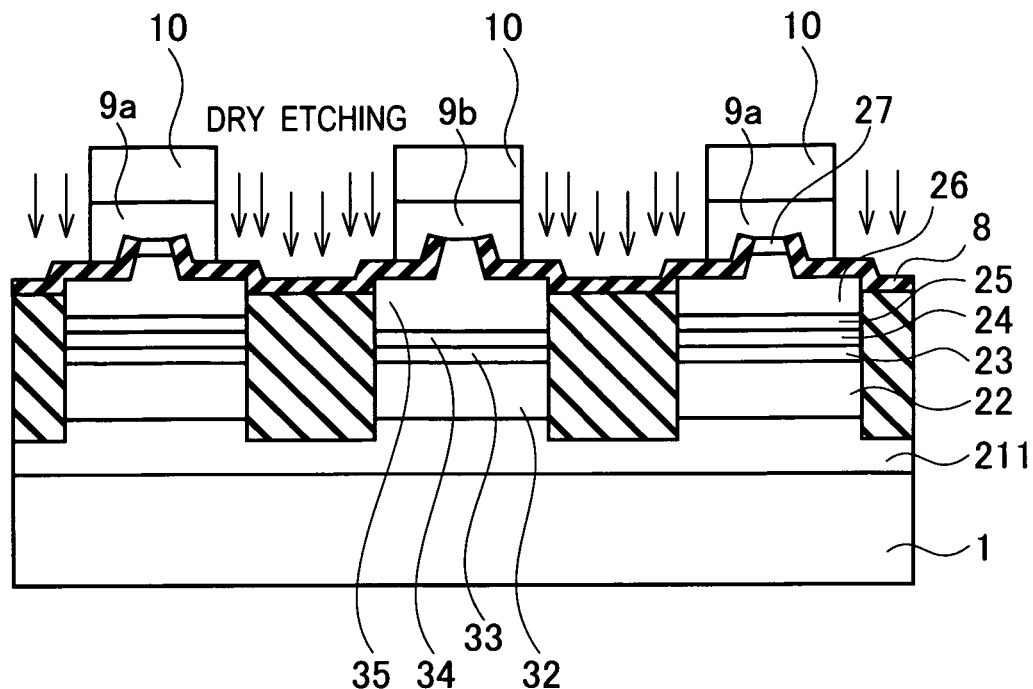
FIG. 12 is a view illustrating a process of manufacturing the first double wavelength light emitting device.

Subsequently, as shown in FIG. 11, a p electrode layer 91 is deposited and then a mask 10 is patterned in an area in which a p electrode is to be formed. As shown in FIG. 12, excessive part of the p electrode layer 91 are removed by dry-etching to form p electrodes 9a and 9b.

Figure 13:
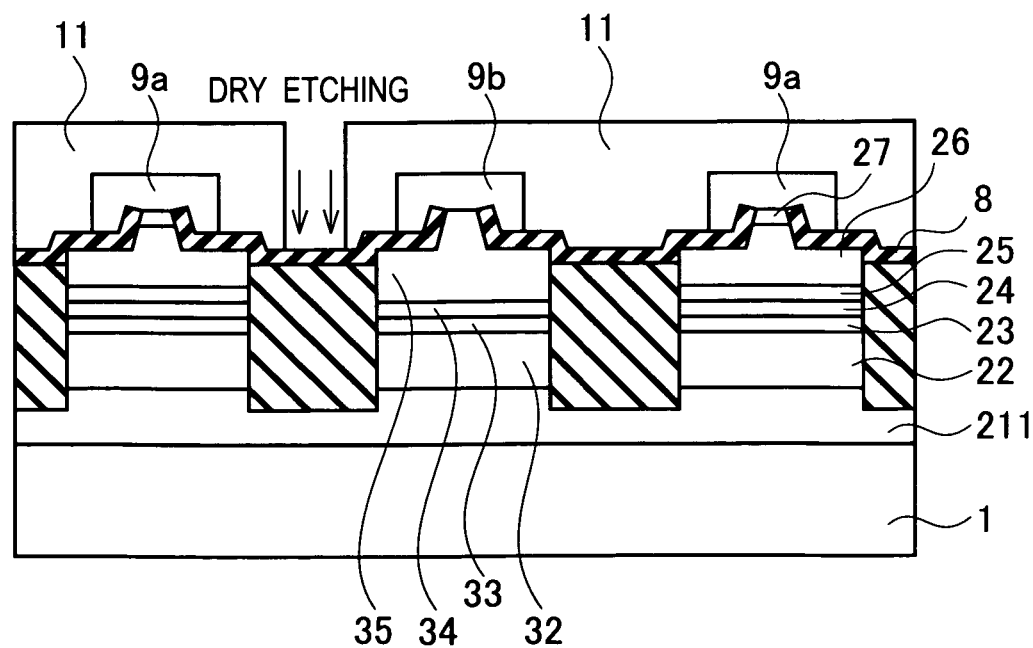
FIG. 13 is a view illustrating a process of manufacturing the first double wavelength light emitting device.
Figure 14:
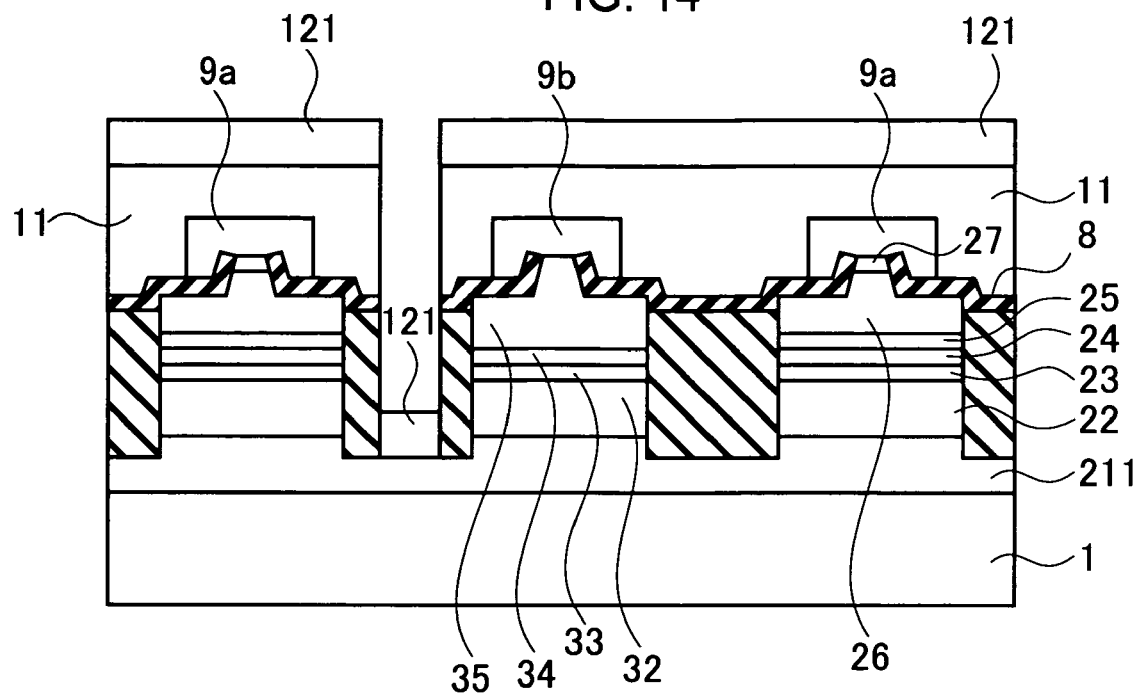
FIG. 14 is a view illustrating a process of manufacturing the first double wavelength light emitting device.

As shown in FIG. 13, mesa-patterning is then performed on a resist 11 except in an area in which n electrode is to be deposited and dry-etching is performed to remove the insulating films 8 and 40 on a region for the n electrode. AS shown in FIG. 14, an n electrode layer 121 is then deposited by vapor depositing or spattering. Thereafter, the resist 11 is lifted up, for example, by dipping the wafer in an acetone solution, to form an n electrode 12 serving as a common electrode of the semiconductor lasers D1 and D2.

Figure 15:
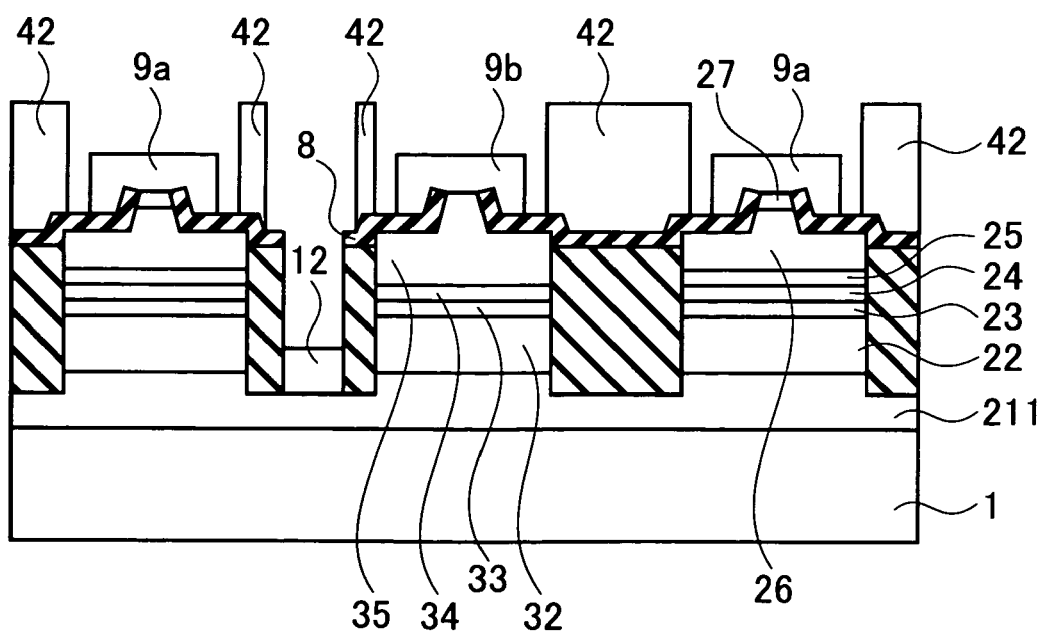
FIG. 15 is a view illustrating a process of manufacturing the first double wavelength light emitting device.

AS shown in FIG. 15, a resist 42 is patterned except in an area in which a pad electrode is to be formed. A pad electrode layer is deposited by vapor depositing or spattering. Then, the resist 42 is lifted off. Consequently, as shown in FIG. 16, a p side pad electrode 13a is formed on the p electrode 9a, a p side pad electrode 13b is formed on the p electrode 9b, and an n side pad electrode 13c is formed on the n electrode 12.

Figure 16:
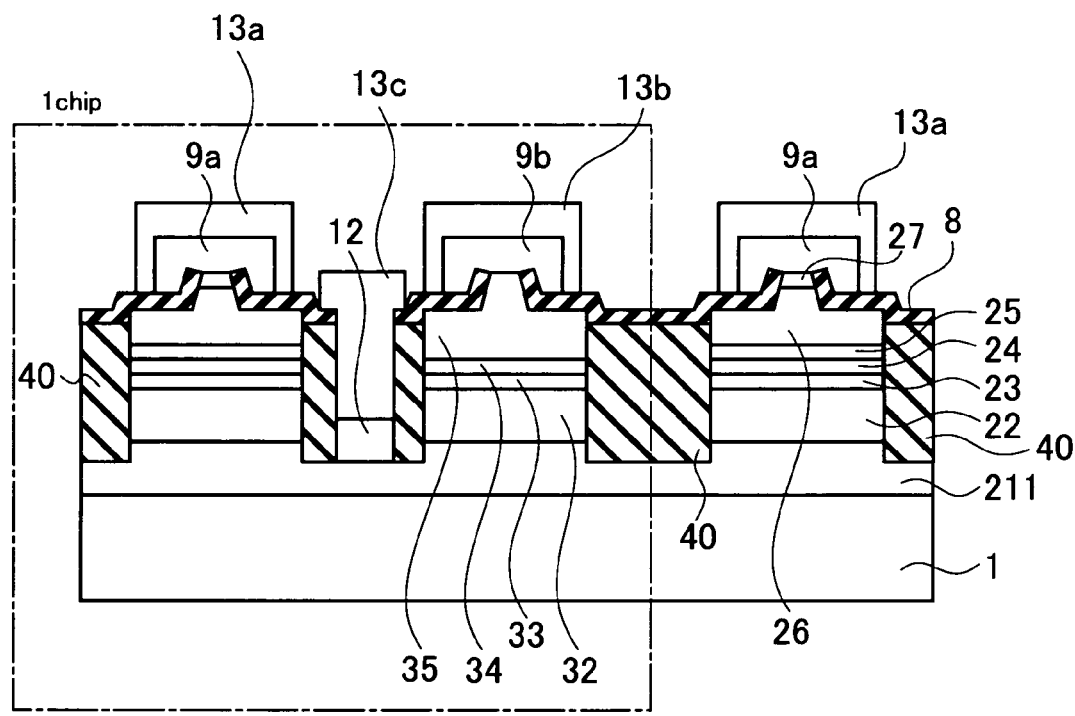
FIG. 16 is a view illustrating a process of manufacturing the first double wavelength light emitting device.

FIG. 1 shows an entire overview of the cross-sectional structure shown in FIG. 16. An area surrounded by a dashed-dotted line is separated by dicing or the like to have one chip so that a double wavelength semiconductor light emitting device is completed.

Figure 17:
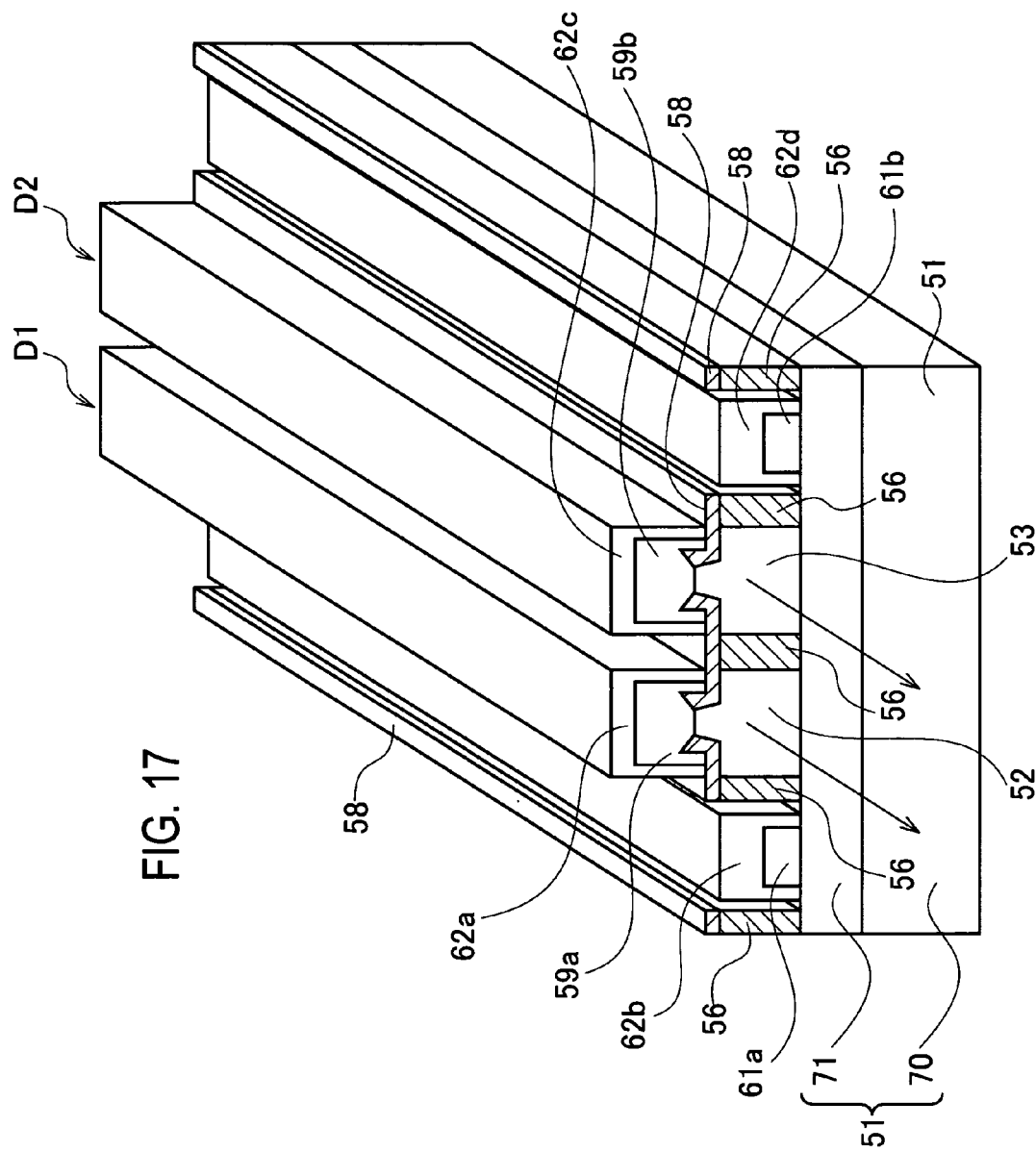
FIG. 17 is a view illustrating a schematic structure of a second double wavelength light emitting device.

FIG. 17 shows a schematic structure of a second double wavelength semiconductor light emitting device of the present invention. The semiconductor lasers D1 and D2 are integrally formed as two light emitting elements having different emission wavelengths on the same substrate 51. Specifically, an n-type contact layer 71 is deposited on a growth substrate 70. A sapphire substrate, GaN substrate, and SiC substrate are used for the growth substrate 70. Additionally, an n-type GaN layer or the like is used for the n-type contact layer 71 common to each of the semiconductor lasers D1 and D2.

One chip is composed according to the structure in FIG. 17. In reality, the semiconductor lasers D1 and D2 of FIG. 17 are made as one set, this is repeatedly formed to multiple sets, and thereby, a wafer is formed. Cutting by dicing or the like is performed for each portion surrounded by the dashed-dotted line to have a chip from the wafer. Incidentally, the arrows depicted in FIG. 17 indicate the output direction of the laser beam.

In the semiconductor laser D1, a semiconductor laminate C (52 in the figure) having a stripe-shape ridge portion is deposited on the n-type contact layer 71 of the substrate 51. In the semiconductor laser D2, a semiconductor laminate D (53 in the figure) having a stripe-shape ridge portion is deposited on the n-type contact layer 71 of the substrate 51, similarly. A configuration is made to have different layer structures between the semiconductor laminates C (52) and D (53). An insulating film 58 (a shaded area) is formed in a manner to cover side surfaces of the ridge portions of the semiconductor laminates C and D. An insulating film 56 (shaded area) is formed on a part of the surface of the n-type contact layer 71 and each side surface of the semiconductor laminates C and D. Areas shaded by the same kind of a diagonal represent the same insulating film.

A p electrode 59a is formed such that the top of the ridge portion of the semiconductor laminate C and the insulating film 58 are covered. In the same manner, a p electrode 59b is formed such that the top of the ridge portion of the semiconductor laminate D and the insulating film 58 are covered. Furthermore, for wire bonding and the like, a p side pad electrode 62a is formed on the p electrode 59a of the semiconductor laser D1 and a p side pad electrode 62c is formed on the p electrode 59b of the semiconductor laser D2.

N electrodes 61a and 61b corresponding to the respective semiconductor lasers D1 and D2 are disposed to sandwich the semiconductor laminates C and D at both sides of the semiconductor laminates C and D, and formed on the common substrate 51.

For wire bonding and the like, an n side pad electrode 62b is formed on the n electrode 61a and an n side pad electrode 62d is formed on the n electrode 62b.

In the double wavelength semiconductor light emitting device in which an n electrode and a p electrode are arranged on the same surface side as described above, the n electrode is not disposed between the semiconductor laminates C and D, but disposed to sandwich the semiconductor laminates C and D. Accordingly, the semiconductor laminates C and D can be deposited close to each other. Therefore, each active layer included in the semiconductor laminates C and D can be formed in positions close to each other and the number of chips to be taken from a single wafer can be increased. In addition, the focusing performance of the optical beams having different wavelengths from each other can further be improved as compared to the above first double wavelength semiconductor light emitting device.

A method of manufacturing the second double wavelength semiconductor light emitting device shown in FIG. 17 will be described by using FIGS. 18 to 31. Here, the semiconductor laser D1 is assumed to be, for example a short wavelength blue laser. The semiconductor laser D2 is assumed to be, for example a long wavelength green laser. A wafer including the substrate 51 and a semiconductor layer deposited thereon extends in transverse, forward and backward directions of the paper, similarly to FIG. 17, represents one chip as one set of the semiconductor lasers D1 and D2 among repeatedly formed ones. Here, the semiconductor laminate C corresponds to a first laminate. The semiconductor laminate D corresponds to a second laminate.

Figure 18:
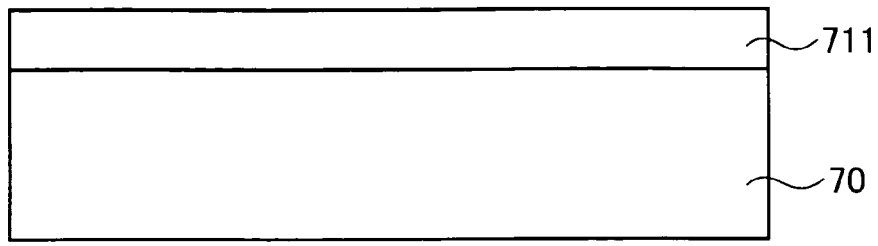
FIG. 18 is a view illustrating a process of manufacturing the second double wavelength light emitting device.

Firstly, to form a short wavelength semiconductor laser D1, the growth substrate 70 is placed in an MOCVD (metalorganic chemical vapor deposition) apparatus to be thermal-cleaned while hydrogen gas is flown and a temperature is increased to about 1050° C. The temperature is reduced to about 600° C. to grow a Si-doped n-type GaN contact layer 711 as an n-type contact layer 71 on the growth substrate 70 as shown in FIG. 18.

Figure 19:
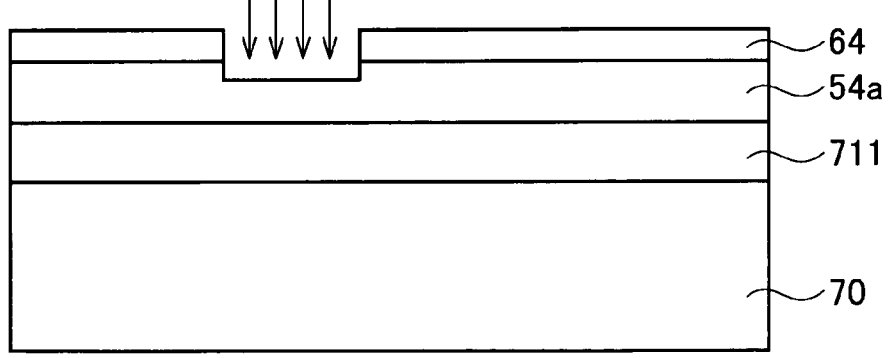
FIG. 19 is a view illustrating a process of manufacturing the second double wavelength light emitting device.

As shown in FIG. 19, an insulating film 54a is formed on the n-GaN contact layer 711. A resist 64 is patterned on the insulating film 54a except in an area in which the semiconductor laminate C is to be formed. A Si-based film such as SiO₂, Si₃N₄ or the like on which GaN is impossible to grow and which is easily wet-etched, is used for the insulating film 54a. Use of this Si-based film allows the shape of the semiconductor laminate C to be obtained by simply laminating semiconductor layers constituting the semiconductor laminate C on the wafer as described below. Then, the insulating film 54a in an area in which the semiconductor laminate C is to be formed is removed by wet-etching.

Figure 20:
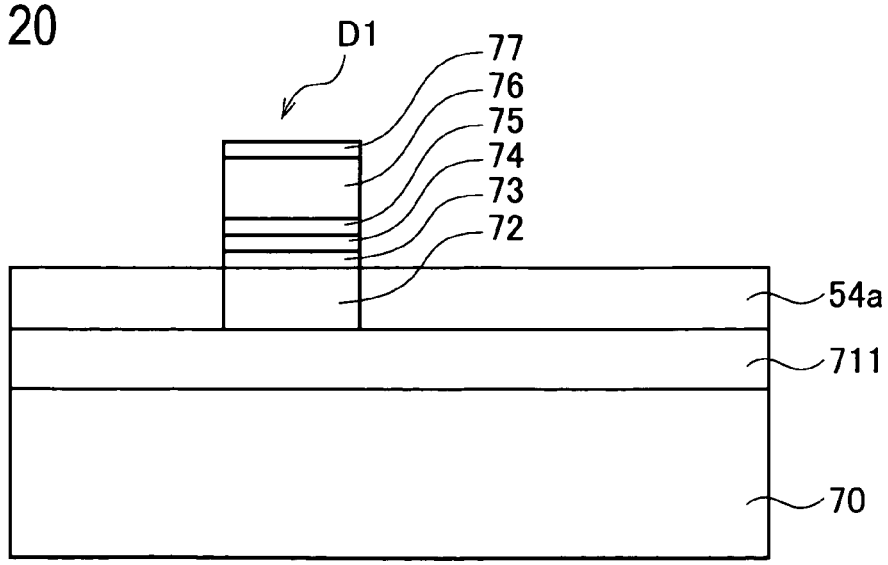
FIG. 20 is a view illustrating a process of manufacturing the second double wavelength light emitting device.

As shown in FIG. 20, to laminate the semiconductor laminate C, the wafer is again introduced in the MOCVD apparatus. Then, the temperature is again increased to 1000° C. to grow a Si-doped n-type AlGaN clad layer 72 and a Si-doped n-type GaN optical guide layer 73.

The temperature is then reduced to about 750° C. to grow an InGaN active layer 74. Thereafter, the temperature is increased to about 1000° C. to 1100° C. to sequentially deposit a Mg-doped p-type GaN optical guide layer 75, Mg-doped p-type AlGaN clad layer 76 and Mg-doped p-type GaN contact layer 77.

The InGaN active layer 74 may be a single InGaN layer structure and may also have a multiple quantum well structure. In the latter case, the multiple quantum well structure is configured by alternately laminating a well layer and a barrier layer (an obstacle layer) through several cycles where the well layer is formed of InGaN and the barrier layer is formed of undoped GaN or InGaN. As described above, D1 is assumed to be a semiconductor laser having a blue light emission wavelength (short wavelength side). Therefore, the InGaN active layer 74 is preferably has an In composition of around 15% and has the InGaN well layer of around 30 Å.

The Al composition of n-AlGaN clad layer 72 is preferably up to 10%. The film thickness is preferably 1.2 μm or less to prevent a crack. The n-GaN optical guide layer 73 may be an n-InGaN optical guide layer. In this case, the In composition is preferably up to 3%.

The p-GaN optical guide layer 75 may also be a p-InGaN optical guide layer. In this case, the composition In is preferably up to 3%. Specifically, the p-AlGaN clad layer 76 preferably has an Al of up to 10% and a film thickness of up to 0.4 μm. Here, the n-AlGaN clad layer 72 to the p-GaN contact layer 77 correspond to the semiconductor laminate C (52).

Figure 21:
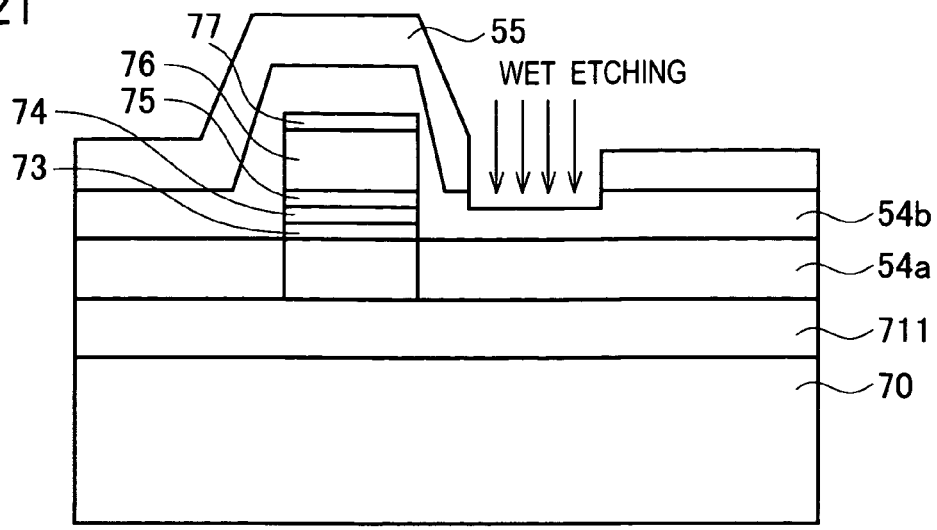
FIG. 21 is a view illustrating a process of manufacturing the second double wavelength light emitting device.

As shown in FIG. 21, an insulating film 54b is then deposited in a manner to cover the insulating film 54a and the entire semiconductor laminate C. A Si-based film such as SiO₂, Si₃N₄ or the like on which GaN is impossible to grow and which is easily wet-etched is used also for this insulating film 54b similarly for the insulating film 54a. In this manner, simply laminating the semiconductor layers constituting the semiconductor laminate D as described below causes the shape of the semiconductor laminate D to be obtained, when the semiconductor laminate D is formed. A mask 55 is patterned except in an area in which the semiconductor laminate D is to be formed, and then wet-etched is performed.

Figure 22:
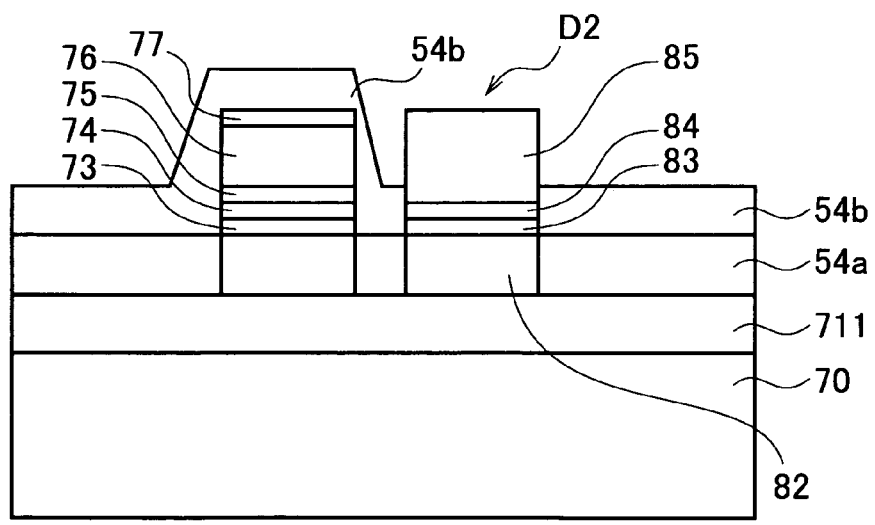
FIG. 22 is a view illustrating a process of manufacturing the second double wavelength light emitting device.

After the mask 55 has been lifted off, the semiconductor laminate D of the semiconductor laser D2 is deposited as shown in FIG. 22 in an area in which the wet-etching has been carried out in FIG. 21. To grow the semiconductor laminate D, the temperature is again increased to about 1000° C. in the MOCVD apparatus to crystal-grow a Si-doped n-type AlGaN clad layer 82 and an Si-doped n-type GaN optical guide layer 83 on the n-GaN contact layer 711. Then, the temperature is reduced to about 750° C. to grow an InGaN active layer 84. Thereafter, the temperature is increased to about 850° C. to grow a Mg-doped p-type InGaN layer 85. Here, the n-AlGaN clad layer 82 to the p-InGaN layer 85 correspond to the semiconductor laminate D (53).

The InGaN active layer 84 may be a single layer of Si-doped n-type InGaN and may also have a multiple quantum well structure. In the latter case, the multiple quantum well structure is configured by alternately laminating a well layer and a barrier layer through several cycles where the well layer is formed of Si-doped n-type InGaN and the barrier layer is formed of Si-doped n-type GaN. As described above, D1 is assumed to be a semiconductor laser having a green light emission wavelength (long wavelength side). Therefore, the InGaN active layer 84 preferably has an In composition of around 20% and has the InGaN well layer of around 30 Å. Having a barrier layer of n-type GaN enables growth at about 750° C. similarly for the well layer.

Similarly in the semiconductor laminate C, the n-AlGaN clad layer 82 preferably has an Al composition of up to 10% and a thickness of 1.2 μm or less to prevent a crack. The n-GaN optical guide layer 83 may be an n-InGaN optical guide layer. In this case, an In composition is preferably up to 3%. In addition, the p-InGaN layer 85 preferably has an In composition of up to 3% and a thickness of 0.5 μm to obtain good film quality.

Meanwhile, $Al_xGa_yN$ (However, $X+Y=1$, $0 \leq X < 1$, $0 < Y \leq 1$) has been conventionally used for a p-type current injection layer. However, growth at a temperature higher than 1000° C. is necessary to obtain $Al_xGa_yN$ showing a good p-type conduction. However, growth of p-type $Al_xGa_yN$ at a temperature higher than 1000° C. particularly causes the InGaN active layer 84 having a large In composition on a long wavelength side to be easily deteriorated and destroyed. A light emitting device having a longer wavelength has an increased composition of In contained in the active layer. As the In composition is increased, In in the active layer sublimates and separates at a high temperature, so that the active layer is easily deteriorated and destroyed. Therefore, the InGaN active layer 84 needs to be grown at 900° C. or less.

If the semiconductor laminate D is first crystal-grown and if p-type AlGaN and GaN are also used on the semiconductor laminate D side as in the semiconductor laminate C, the InGaN active layer 84 is exposed to a high temperature of 1000° C. or more for a longer time period after the deposition of the InGaN active layer 84 having a large In composition. In contrast, by growing the semiconductor laminate C on the short wavelength side first, a reduction is enabled in a duration of time of exposure of the InGaN active layer 84 to a high temperature of 1000° C. or more for a reduced time period after the deposition of the InGaN active layer 84 having a large In composition so that the InGaN active layer 84 can be prevented from being deteriorated.

Furthermore, as for the semiconductor laminate D, a p-GaN optical guide layer and a p-AlGaN clad layer are not formed unlike in the semiconductor laminate C, and a P-InGaN layer 85 is deposited on the InGaN active layer 84. Therefore, crystal growth is enabled at a low temperature of 900° C. or less even after the deposition of the InGaN active layer 84. In addition, in a case where the InGaN active layer 84 has a quantum well structure, having a barrier layer of n-type GaN enables growth at the same temperature as that in the well layer by using n-type GaN as the barrier layer so that the InGaN active layer 84 can be prevented from being deteriorated and destroyed. Incidentally, the p-InGaN layer 85 serves as a semiconductor layer doing double duty of a clad layer and a contact layer.

Figure 23:
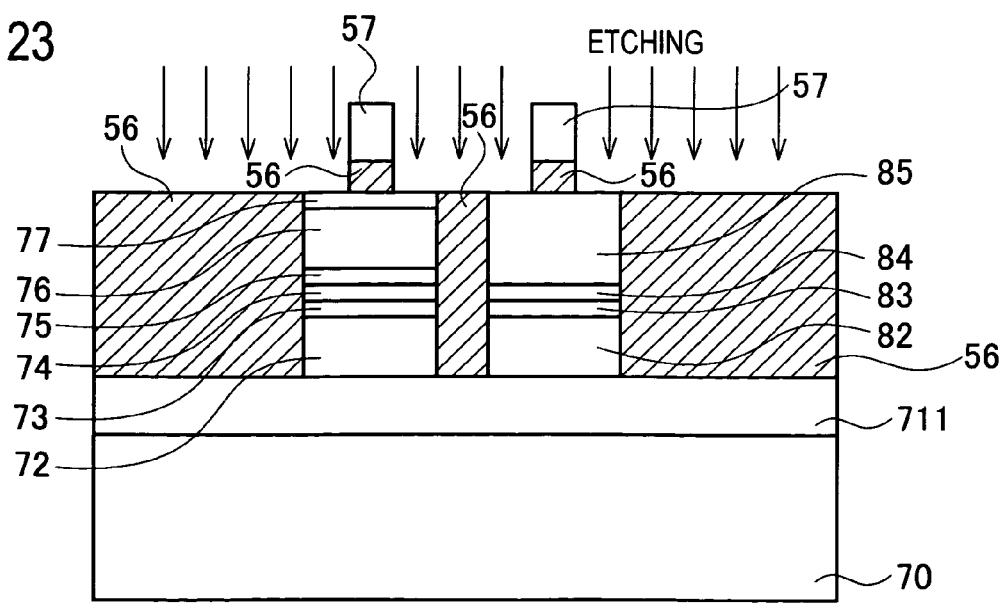
FIG. 23 is a view illustrating a process of manufacturing the second double wavelength light emitting device.
Figure 24:
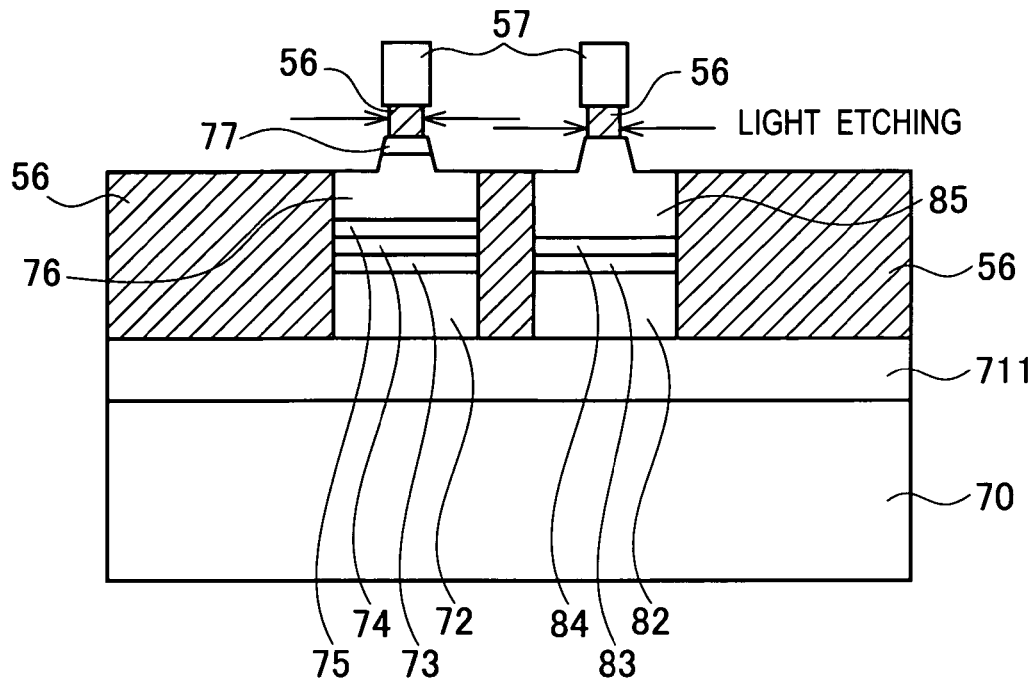
FIG. 24 is a view illustrating a process of manufacturing the second double wavelength light emitting device.

The insulating films 54a and 54b are then removed as shown in FIG. 23. Thereafter, an insulating film 56 is applied on the substrate 51 and a mask 57 is patterned in a stripe pattern and etched to form stripe-shape ridge portions on the semiconductor laminates C and D at the same time. As shown in FIG. 24, light etching is performed by soaking the wafer in hydrofluoric acid or the like to melt part of the insulating film 56 and adjust the shape of the ridge portion as well.

Figure 25:
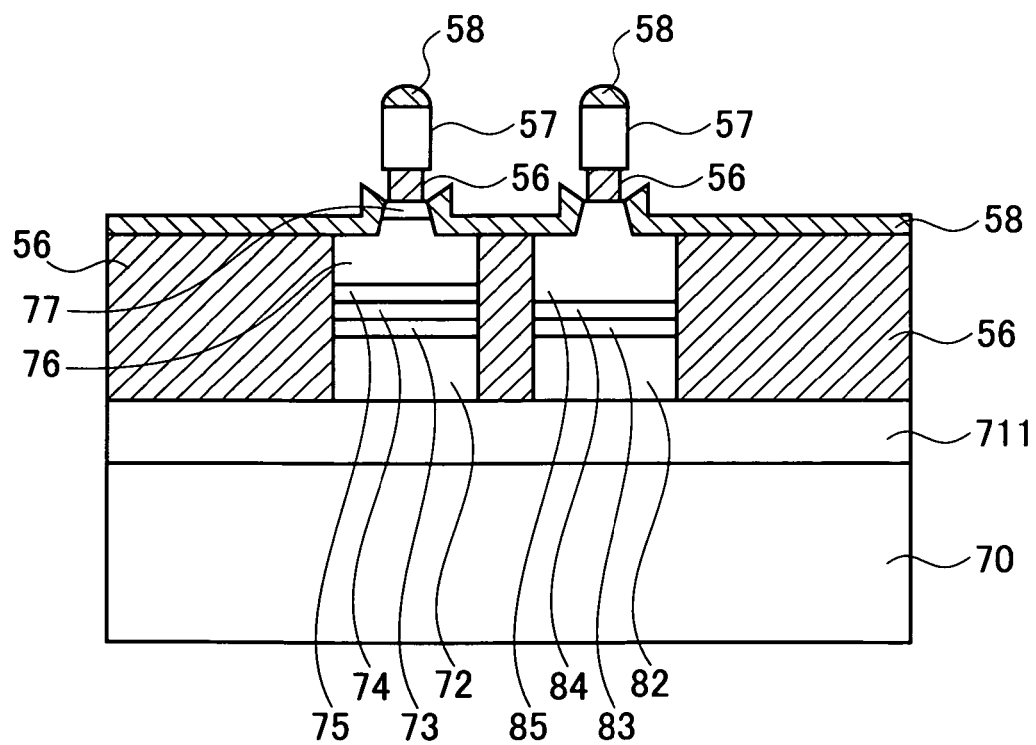
FIG. 25 is a view illustrating a process of manufacturing the second double wavelength light emitting device.
Figure 26:
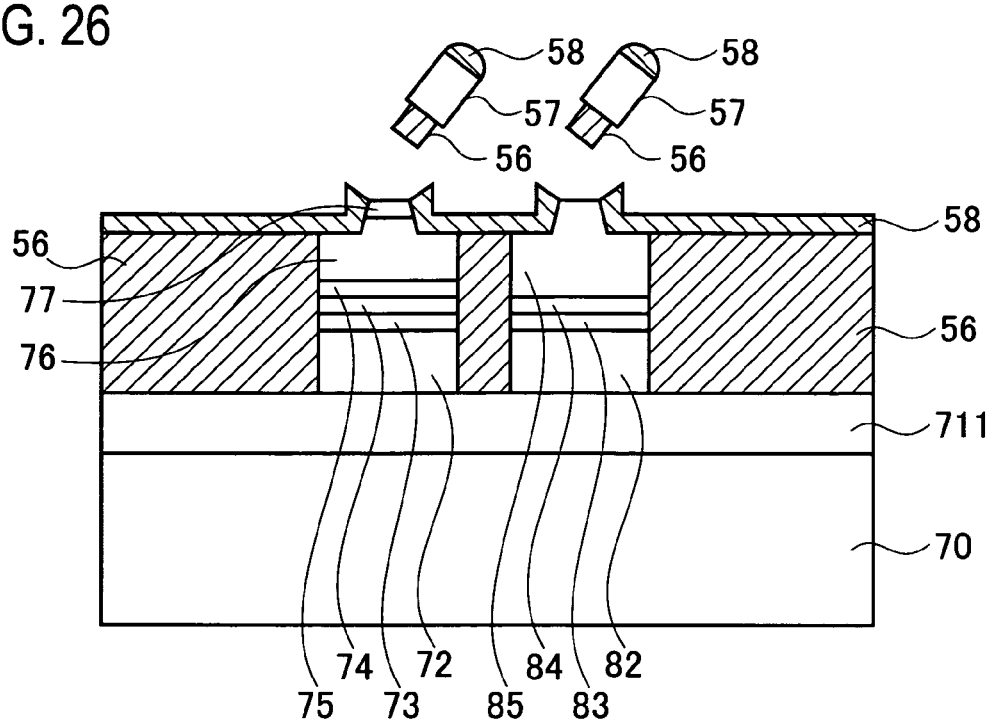
FIG. 26 is a view illustrating a process of manufacturing the second double wavelength light emitting device.

As shown in FIG. 25, an insulating film 58 made of a material different from that of the insulating film 56 is formed, by spattering, on the side surfaces of the ridge portions of the semiconductor laminates C and D and on the top surface of the insulating film 56. As shown in FIG. 26, the insulating film 56 on the ridge portion is completely melted in a state where the wafer is soaked in the hydrofluoric acid again to remove the mask 57 and the insulating film 58 formed on the ridge portion.

Figure 27:
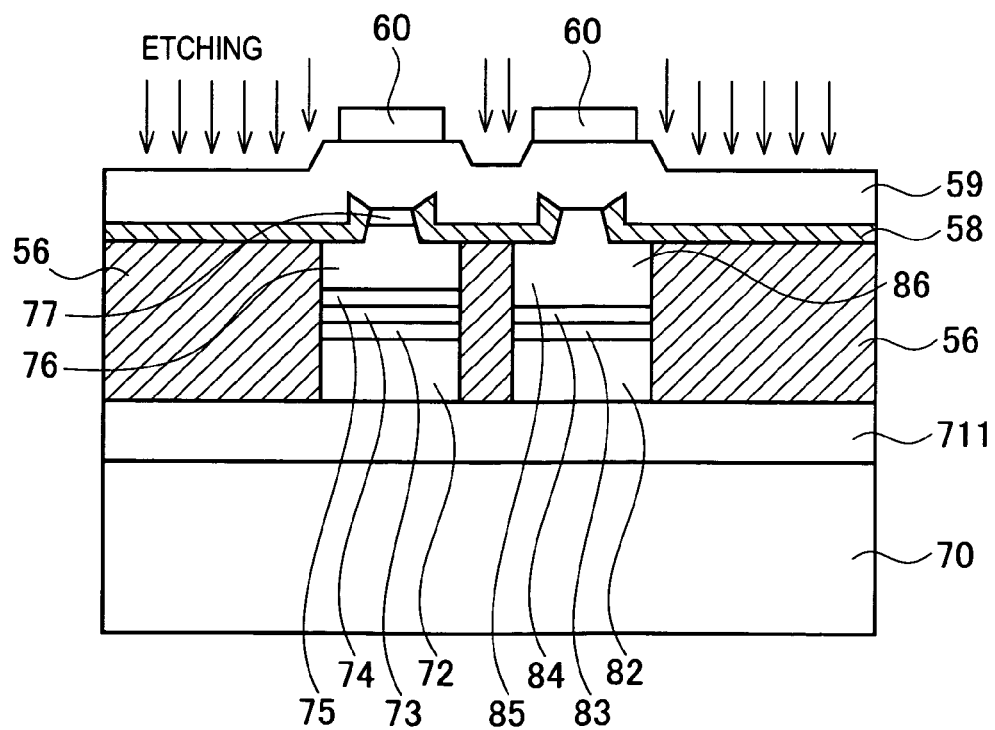
FIG. 27 is a view illustrating a process of manufacturing the second double wavelength light emitting device.

As shown in FIG. 27, a p electrode layer 59 is then deposited. Thereafter, a mask 60 is patterned in an area in which a p electrode is to be formed. Then, excessive part of the p electrode layer 59 is removed by etching to form p electrodes 59a and 59b.

Figure 28:
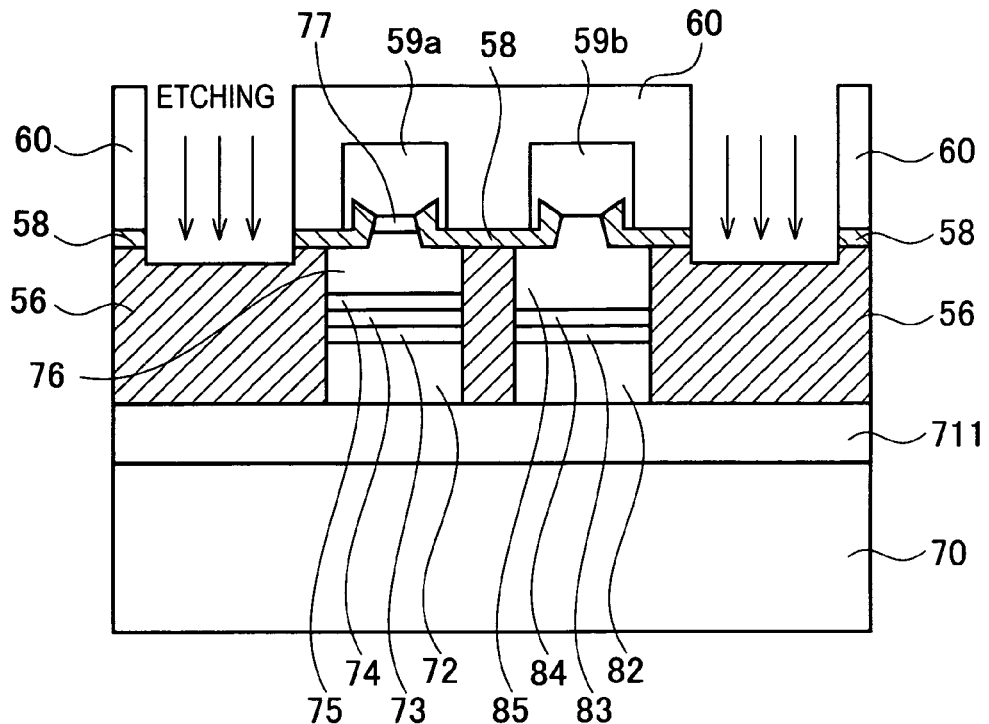
FIG. 28 is a view illustrating a process of manufacturing the second double wavelength light emitting device.
Figure 29:
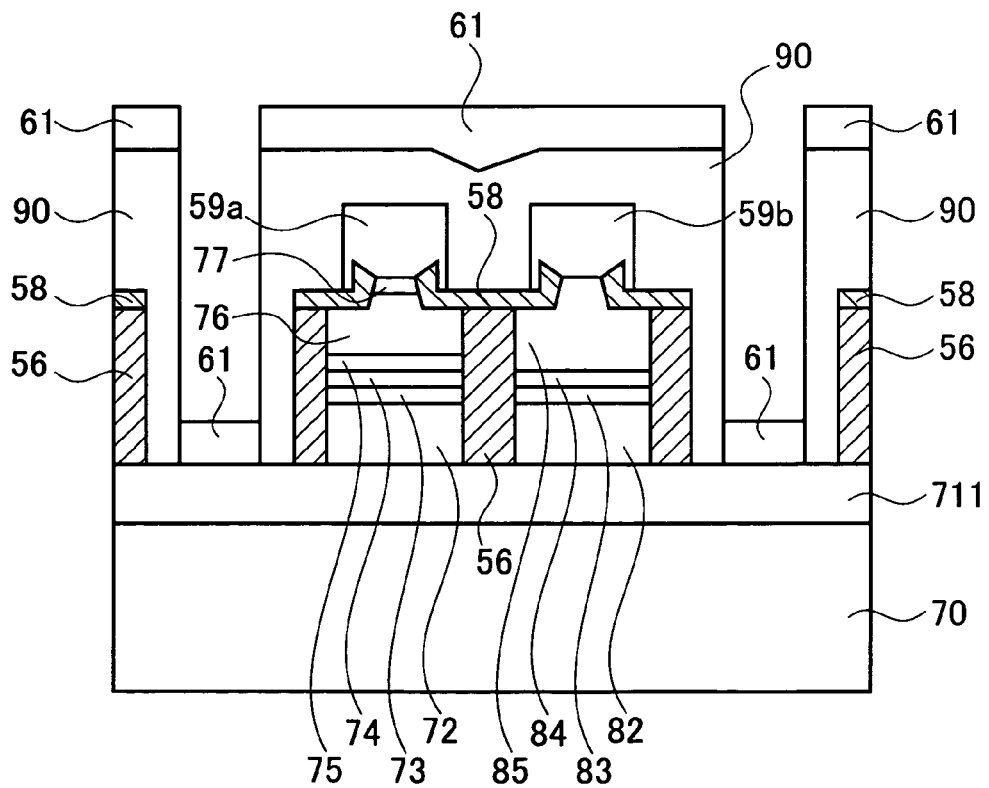
FIG. 29 is a view illustrating a process of manufacturing the second double wavelength light emitting device.
Figure 30:
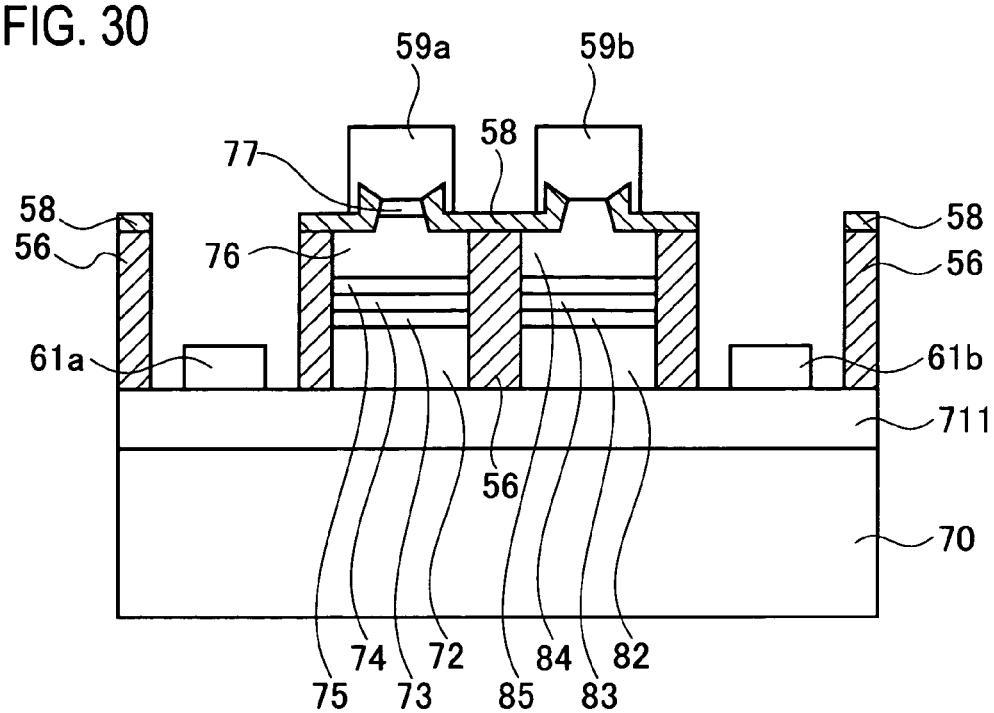
FIG. 30 is a view illustrating a process of manufacturing the second double wavelength light emitting device.

As shown in FIG. 28, the mask 60 is then mesa-patterned and etched to remove a part of the insulating films 58 and 56 so as to form an n electrode. Subsequently, as shown in FIG. 29, a resist 90 is patterned except in an area in which an n electrode is to be deposited and an n electrode layer 61 is deposited by vapor deposition or spattering. When the resist 90 is then lifted off, n electrodes 61a and 61b corresponding to the semiconductor lasers D1 and D2, respectively, are formed on the n-GaN contact layer 711 in a manner to sandwich the semiconductor laminates C and D, as shown in FIG. 30.

Figure 31:
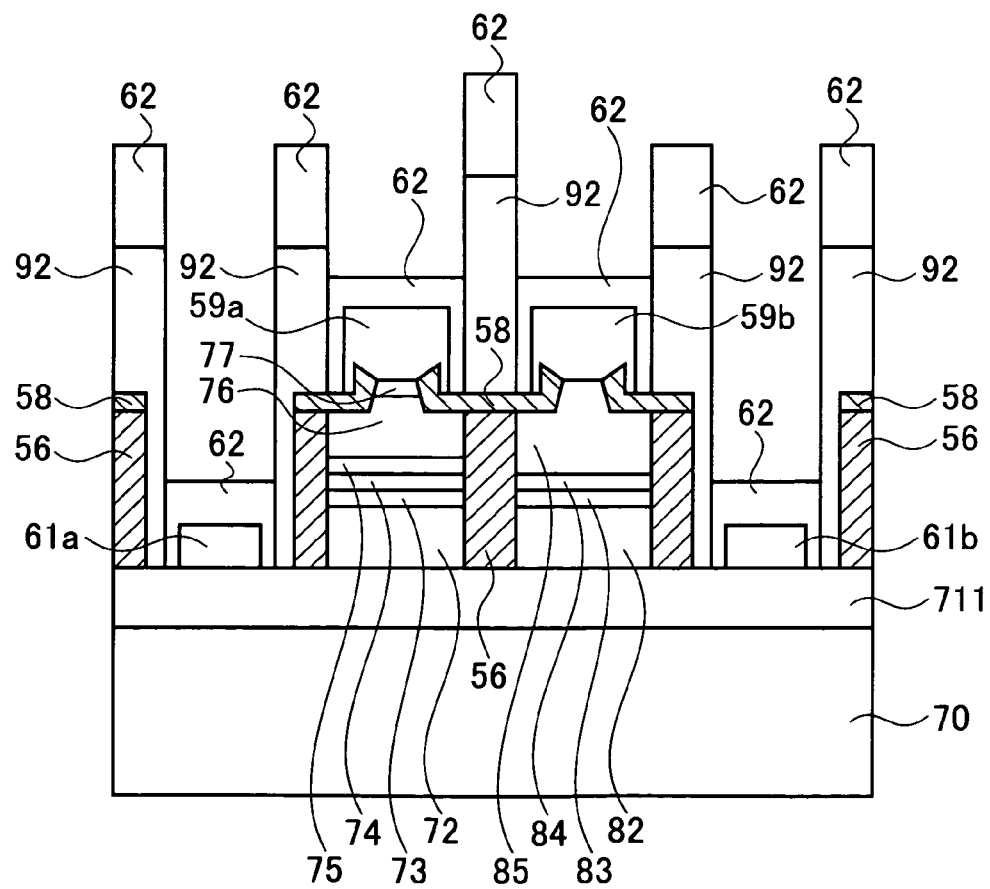
FIG. 31 is a view illustrating a process of manufacturing the second double wavelength light emitting device.

As shown in FIG. 31, a resist 92 is then patterned except in an area in which a pad electrode is to be formed and pad electrodes 62 are deposited by vapor deposition or spattering. When the wafer is thereafter soaked in an acetone solution, the resist 92 is melted to form a p side pad electrode 62a on the p electrode 59a, a p side pad electrode 62c on the p electrode 59b, an n side pad electrode 62b on the n electrode 61a and an n side pad electrode 62d on the n electrode 61b as shown in FIG. 17 so that a double wavelength semiconductor light emitting device is completed.

The invention claimed is:

1. A double wavelength semiconductor light emitting device in which two light emitting elements including a p-type semiconductor layer and an n-type semiconductor layer for emitting lights having different wavelengths are formed on one single substrate and in which an n electrode and p electrodes corresponding to the two light emitting elements are disposed, wherein
the n electrode is an n side electrode common to the two light emitting elements;
the active layers in the two light emitting elements are composed of nitride layers containing Indium at different composition ratios; and
the two light emitting elements include an insulating film isolating the two light emitting elements electrically and disposed in a ditch part reaching the n-type semiconductor layer through the p-type semiconductor layer at least, and an insulating film limiting current injection areas to the active layers.

2. The double wavelength semiconductor light emitting device according to claim 1, wherein
the two light emitting elements are formed to interpose the n electrode, and the nitride semiconductor layer structures of those light emitting elements are different.

3. The double wavelength semiconductor light emitting device according to claim 1, wherein
the n electrode and p electrodes corresponding to the two light emitting elements are disposed on the same surface side of the substrate.

4. The double wavelength semiconductor light emitting device according to claim 2, wherein
the n electrode and p electrodes corresponding to the two light emitting elements are disposed on the same surface side of the substrate.

5. A double wavelength semiconductor light emitting device in which two laminates including a p-type semiconductor layer and a n-type semiconductor layer for emitting lights having different wavelengths are formed on one substrate and in which n electrodes and p electrodes corresponding to the two laminates are disposed on the same surface side of the substrate, wherein
the two n electrodes corresponding to the two laminates are disposed to interpose the two laminates on the substrate; and
the active layers in the two laminates are composed of nitride layers containing Indium at different composition ratios; and
the two light emitting elements include an insulating film isolating the two laminates electrically and disposed in a ditch part reaching the n-type semiconductor layer through the p-type semiconductor layer at least, and an insulating film limiting current injection areas to the active layers.

6. The double wavelength semiconductor light emitting device according to claim 1, wherein
the n-type semiconductor layer includes an n-type contact layer, and an n-type clad layer between the n-type contact layer and the p-type semiconductor layer, and
the ditch part is formed to reach the n-type contact layer through the n-type clad layer.

7. The double wavelength semiconductor light emitting device according to claim 2, wherein
the n-type semiconductor layer includes an n-type contact layer, and an n-type clad layer between the n-type contact layer and the p-type semiconductor layer, and
the ditch part is formed to reach the n-type contact layer through the n-type clad layer.

8. The double wavelength semiconductor light emitting device according to claim 5, wherein
the n-type semiconductor layer includes an n-type contact layer, and an n-type clad layer between the n-type contact layer and the p-type semiconductor layer, and
the ditch part is formed to reach the n-type contact layer through the n-type clad layer.

* * * * *